(12) United States Patent
Ray et al.

(10) Patent No.: US 9,143,147 B1
(45) Date of Patent: Sep. 22, 2015

(54) CALIBRATION OF INTER-SLICE GAIN AND OFFSET ERRORS IN TIME-INTERLEAVED ANALOG-TO-DIGITAL CONVERTER

(71) Applicant: Keysight Technologies, Inc., Minneapolis, MN (US)

(72) Inventors: Sourja Ray, Cupertino, CA (US); John Patrick Keane, Menlo Park, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 14/323,821

(22) Filed: Jul. 3, 2014

(51) Int. Cl.
  *H03M 1/10* (2006.01)
  *H03M 1/12* (2006.01)

(52) U.S. Cl.
  CPC .......... *H03M 1/1009* (2013.01); *H03M 1/1023* (2013.01); *H03M 1/12* (2013.01); *H03M 1/121* (2013.01); *H03M 1/1215* (2013.01)

(58) Field of Classification Search
  CPC ...... H03M 1/121; H03M 1/1215; H03M 1/12
  USPC .................................................. 341/120, 118
  See application file for complete search history.

(56) References Cited

U.S. PATENT DOCUMENTS

| | | | | |
|---|---|---|---|---|
| 7,233,270 | B2 * | 6/2007 | Lin ............................... | 341/118 |
| 7,741,982 | B2 * | 6/2010 | Johansson et al. ............ | 341/118 |
| 7,825,839 | B2 * | 11/2010 | Bratfisch et al. ............. | 341/131 |
| 8,698,659 | B2 * | 4/2014 | Hovakimyan et al. ........ | 341/118 |

OTHER PUBLICATIONS

Black, et al., "Time interleaved converter arrays," Solid-State Circuits, IEEE Journal of, vol. 15, No. 6, pp. 1022,1029, Dec. 1980.
Fu, et al., "A digital background calibration technique for time-interleaved analog-to-digital converters," Solid-State Circuits, IEEE Journal of, vol. 33, No. 12, pp. 1904,1911, Dec. 1998.
Jamal et al., "A 10-b 120-Msample/s time-interleaved analog-to-digital converter with digital background calibration," Solid-State Circuits, IEEE Journal of, vol. 37, No. 12, pp. 1618,1627, Dec. 2002.
Setterberg, et al., "A 14b 2.5GS/s 8-way-interleaved pipelined ADC with background calibration and digital dynamic linearity correction," Solid-State Circuits Conference Digest of Technical Papers (ISSCC), 2013 IEEE International, pp. 466,467, Feb. 17-21, 2013.

* cited by examiner

*Primary Examiner* — Brian Young

(57) ABSTRACT

An analog input signal is dithered using a dithering sequence and then partially chopped using a chopping sequence. The dithered and partially chopped signal is then digitized by analog-to-digital converter (ADC) slices operating in alternating fashion, and the resulting digitized signals are adjusted according to the dithering sequence and the chopping sequence to compensate for gain and voltage offset errors of the ADC slices.

24 Claims, 21 Drawing Sheets

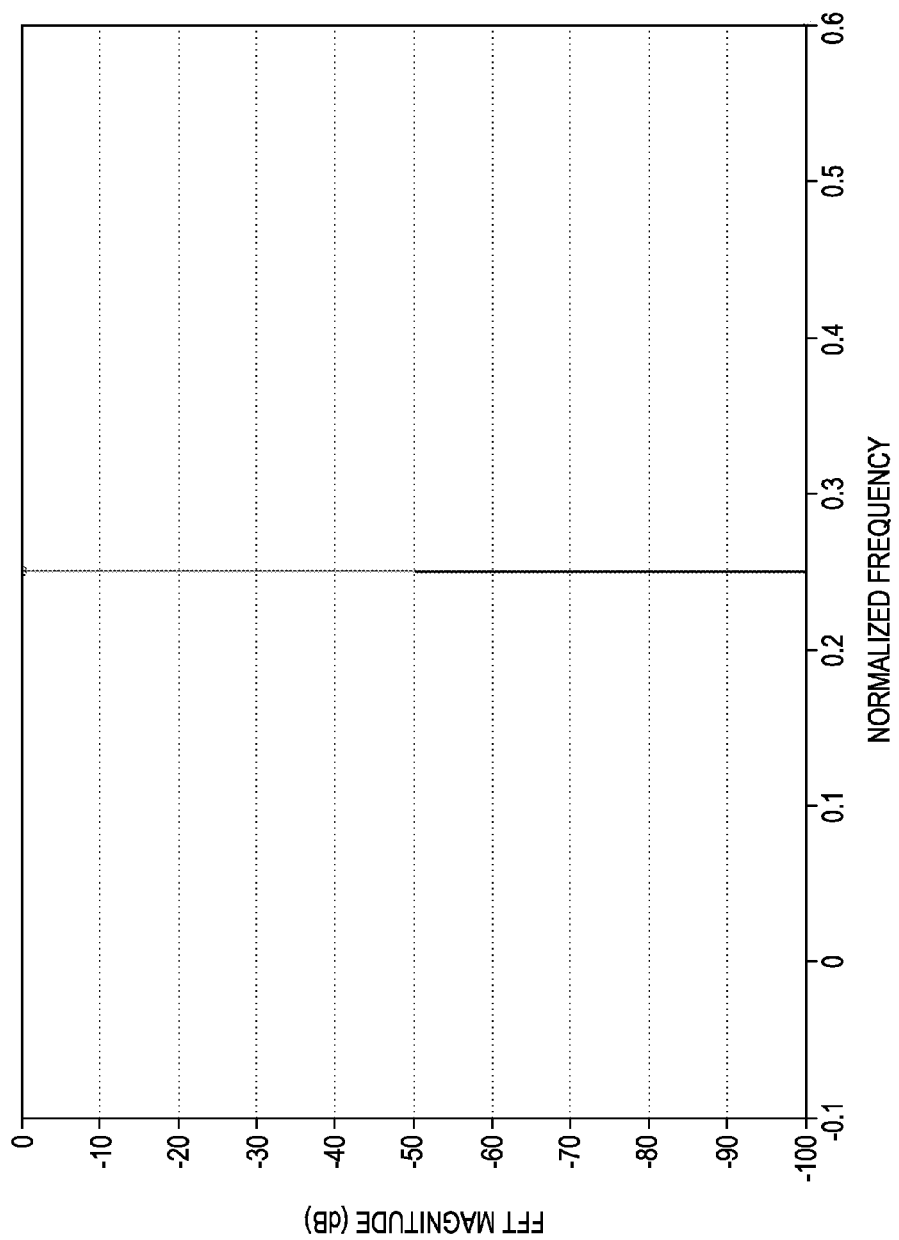

CALIBRATION OF INTER-SLICE GAIN AND OFFSET ERRORS IN TIME-INTERLEAVED ANALOG-TO-DIGITAL CONVERTER

BACKGROUND

It is often practical to implement a high-speed analog-to-digital converter (ADC) by time interleaving multiple lower speed ADCs, called ADC slices. For example, FIG. 1 shows a high-speed ADC 100 implemented by multiple ADC slices #0 through #N-1. ADC slices #0 through #N-1 each operate at a slice sampling rate $f_{slice}$, and they sample an analog input signal $A_{in}$ in round robin fashion such that the aggregate of the sampling rates of the ADCs is equal to a desired higher overall sampling rate $f_{ADC}$. Lower rate digital outputs $Dout_i$ of the ADC slices are processed by corresponding digital signal processors (DSPs) and then combined to reconstruct a desired higher rate digital output stream Dout.

Among the ADC slices, overall gain $g_i$, overall offset $o_i$, sampling timing instant, input sampling bandwidth, and various other transfer function related attributes may differ due to practical manufacturing tolerances, and these differences may limit the achievable performance of ADC 100. As an example, offset mismatches between ADC slices manifest as frequency domain spurs in the digital output of the interleaved ADC at multiples of the slice clock frequency independent of the applied input. Similarly gain mismatches between ADC slices causes the input signal to be modulated by different gains at each time step resulting in frequency domain spurs that look like images of the applied input signal.

Various researchers have studied the effect of these and other interleaving errors and have developed methods to address them. Many of these methods rely on assumptions about the characteristics or statistical properties of the input that may be specific to the overall system in which these ADCs are designed to operate. These assumptions, however, do not necessarily hold true in instrumentation applications where it is not possible for an instrument designer to impose such restrictions on the user. Moreover, calibration techniques used for ADCs targeted to be used in measuring instruments should be robust and cannot rely on the externally applied input signal. As an example, some inter-slice offset calibration algorithms converge incorrectly when the intentional input signal contains a time invariant component like a signal at 0 Hz or a signal that looks like a time invariant input to an ADC slice like a sinusoid at the slice clock rate or at multiples of the slice clock rate. In other words, sub-harmonics of the overall sampling rate alias to a signal at 0 Hz at the input to the ADC slice. Similarly, some inter-slice gain calibration algorithms converge incorrectly when there is no applied signal i.e. the ADC has an idle input.

An alternative calibration approach inserts a pseudo-random dither sequence D and performs a pseudo-random chopping operation in a signal path common to all ADC slices. The inserted dither is used to estimate and correct inter-slice gain errors, and the pseudo-random chopping operation is used to estimate and correct inter-slice offset errors. The estimation and correction is performed continuously, while the desired input samples are converted by the interleaved ADC, and is termed background calibration. The dither insertion and signal-path chopping operations allow the inter-slice gain and inter-slice offset calibrations to operate in a manner independent of the characteristics of the input signal.

In the above approach, semiconductor devices in the signal path heat in a manner that depends upon the signal through these devices. In circuits prior to the chopping operation, this phenomenon results in an error termed as a thermal tail and can be observed as a slow settling behavior in time-domain step response or a filtering effect at low frequencies, because the thermal time constants are much slower than electrical time constants. The thermal tail is a linear effect and can be appropriately characterized and specified. However for circuits after the chopping operation, this slow/low frequency tail gets modulated by the pseudo-random broadband chopping signal and results in a pseudo-randomly modulated thermal tail that spreads throughout the conversion bandwidth. This resembles a broadband noise and severely degrades the signal-to-noise ratio (SNR) of the overall ADC.

In view of at least the above shortcomings of conventional approaches, there is a general need for new approaches for calibrating gain and voltage offsets in interleaved ADCs.

SUMMARY

In a representative embodiment, a method is provided for operating an interleaved ADC comprising a plurality of ADC slices. The method comprises adding a dither to an analog input signal based on a dither sequence, and thereafter splitting the analog input signal into first and second signal components, transmitting the respective first and second signal components through a first signal path and a second signal path, chopping the second signal component in the second signal path using a chopping sequence to produce a chopped second signal component, recombining the chopped second signal component with the first signal component to produce a composite signal, digitizing the composite signal by operating the ADC slices in an alternating fashion to produce a plurality of digital samples, and adjusting the digital samples according to estimated voltage offset errors of the ADC slices determined in relation to the dither sequence and the chopping sequence.

In another representative embodiment, a system comprises an input stage configured to apply a dither to an analog input signal based on a dither sequence, then split the analog input signal into first and second signal components, to transmit the first and second signal components through a first signal path and a second signal path, respectively, wherein the second signal path chops the second signal component according to a chopping sequence to produce a chopped second signal component, and to combine the first signal component with the chopped second signal component to produce a composite signal. The system further comprises a plurality of analog-to-digital converter (ADC) slices configured to digitize the composite signal in an alternating fashion to produce a plurality of digital samples, and a plurality of calibration units corresponding to the plurality of ADC slices, each calibration unit configured to adjust a corresponding subset of the digital samples according to a corresponding estimated voltage offset error determined in relation to the dither sequence and the chopping sequence.

BRIEF DESCRIPTION OF THE DRAWINGS

The described embodiments are best understood from the following detailed description when read with the accompanying drawing figures. Wherever applicable and practical, like reference numerals refer to like elements.

FIG. 6A is a graph illustrating an FFT spectrum of an output signal of an interleaved ADC that samples a sinusoidal input signal having a frequency at a multiple of a slice clock rate, and without gain or offset errors in its ADC slices.

DETAILED DESCRIPTION

Figure 1:
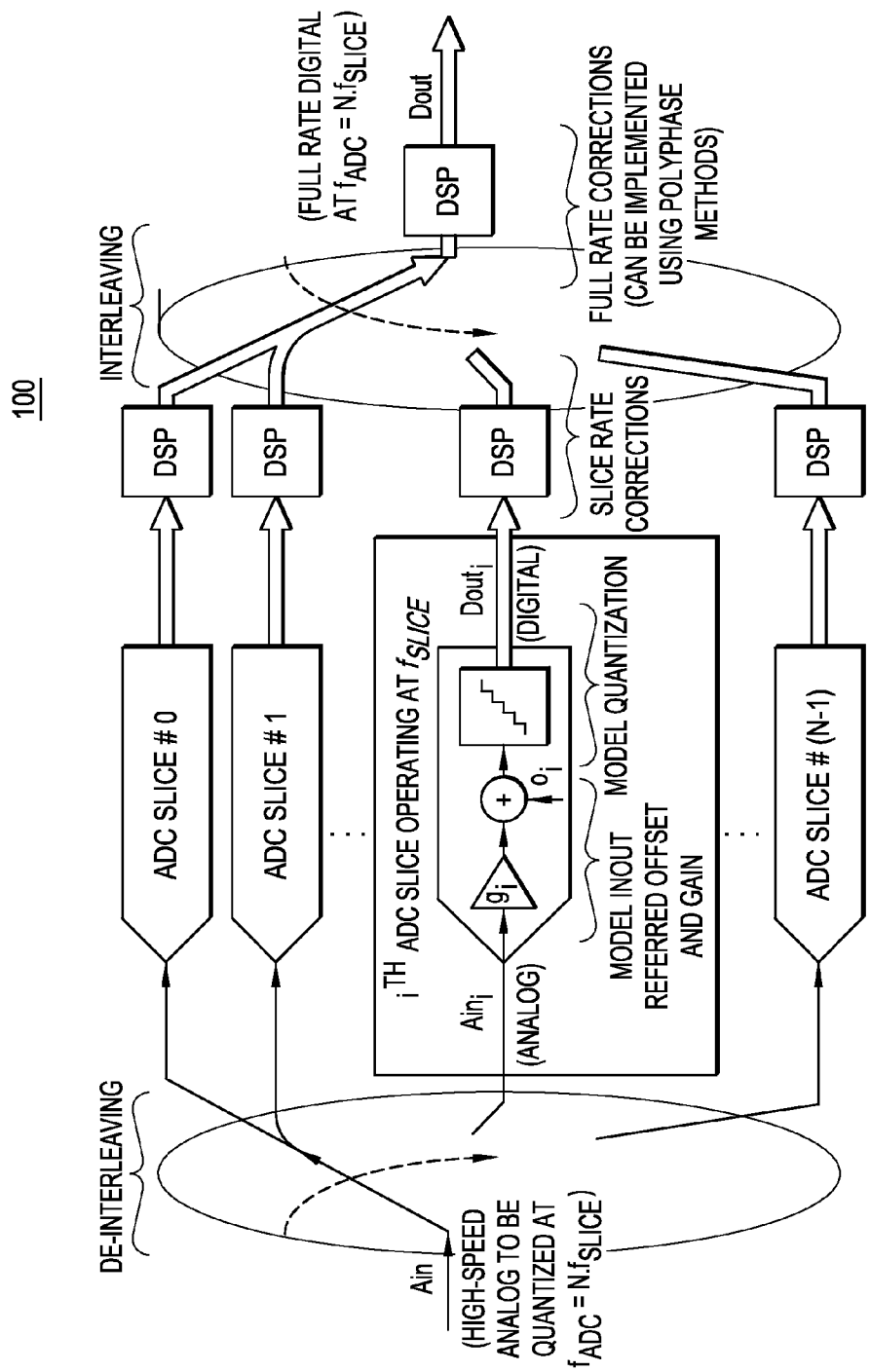
FIG. 1 is a schematic diagram illustrating a conventional interleaved ADC.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices. As used in the specification and appended claims, and in addition to their ordinary meanings, the terms 'substantial' or 'substantially' mean to within acceptable limits or degree. As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

The described embodiments relate generally to interleaved ADCs employing an approach referred to as "partial chopping". in certain embodiments, an interleaved ADC receives an input signal, chops only part of the input signal, and allows a remainder of the input signal to pass through without chopping. A front-end signal path common to all ADC slices is split to two analog paths with one path left un-chopped (a "direct path") and the other path chopped using a pseudo-random chopping sequence (the "chopped path"). Signals in the direct and chopped paths are combined to create a composite signal that is subsequently de-interleaved and digitized. If the gain in the chopped path is smaller than the gain in the direct path, the chopped signal constitutes a small portion of the composite signal, hence the term "partial chopping". The respective gains in the direct and chopped paths nominally add to unity, so the rest of the signal path processes a composite signal that does not exceed the range that would have been occupied by the signal had such a scheme not been used.

A dither is added to the input signal prior to splitting, and is used to measure the portion of the signal transmitted through the chopped path relative to the portion of the signal transmitted through the direct path during the signal reconstruction procedure. The dither is also re-used to perform background calibration of inter-slice gain independent of the input signal. The partial chopping approach permits background calibration of the inter-slice offset independent of the input signal.

When using the partial chopping approach, an error due to a chopped thermal tail is generally smaller than that obtained by a conventional chopping approach because only a small portion of the signal path is chopped. For example if the gain in the chopped path is 10% of the signal range, a 0.1% chopped thermal tail error can potentially now be a 0.01% chopped thermal tail error in the composite signal i.e. instead of a thermal tail that potentially limits the SNR to 60 dB now limits the SNR to 80 dB. This allows a simpler thermal tail correction filter and in some cases could allow the filter to be eliminated.

The described approach does not prevent other complementary techniques to calibrate interleaving errors other than inter-slice offset or gain from being used. Additionally, although not specifically illustrated or described, the described approach could be used to calibrate voltage offset errors without calibrating gain errors or vice versa. In addition, the dither signal can also be fashioned in a way to calibrate inter-slice sampling timing or inter-slice input bandwidth mismatch and this is not specifically described.

A slice rate DSP following the ADC slices may reconstruct a desired signal from the composite signal by performing the following calibration related operations. The gain in the chopped path relative to the direct path is estimated by correlating the composite signal with both the chop and the dither sequences. This allows the algorithm to discriminate between the amount of input referred offset error that has to be corrected and the intentional sub-harmonic or signals with 0 Hz components that have to be preserved thus correcting interleaved offset errors. The signal is then correlated with the dither, allowing the direct path to be measured, and is used to remove the added dither and in turn also corrects the interleaved gain error because the dither is injected in the common path prior to de-interleaving the signal.

Figure 2:
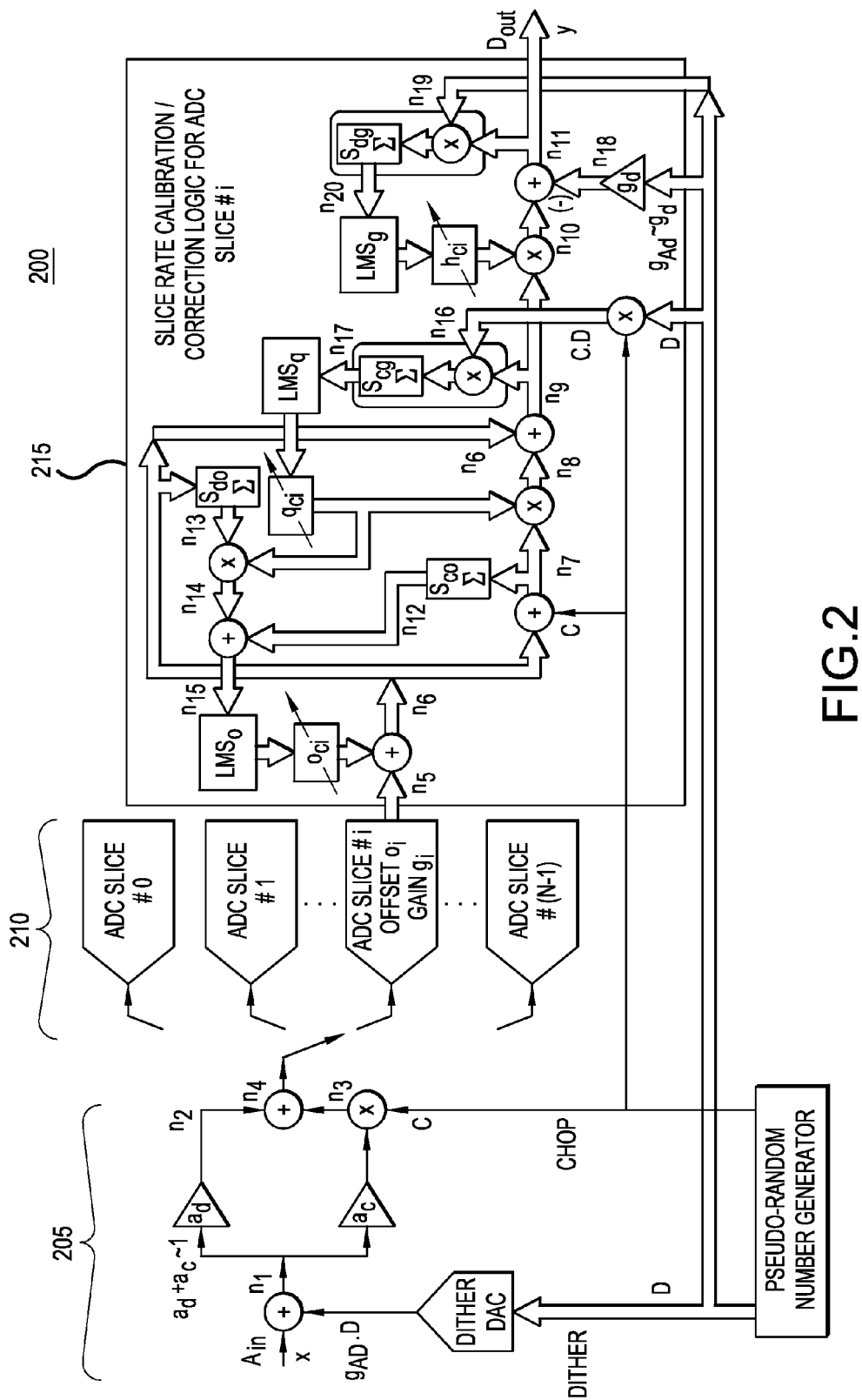
FIG. 2 is a schematic diagram illustrating an interleaved ADC that performs gain and voltage offset calibration using a partial chopping approach according to a representative embodiment.

FIG. 2 is a schematic diagram of an interleaved ADC 200 that performs inter-slice gain error and inter-slice voltage offset error calibration using a partial chopping approach according to a representative embodiment.

Referring to FIG. 2, ADC 200 comprises an input stage 205, a plurality of ADC slices 210, and a plurality of calibration units 215.

Input stage 205 receives an analog input signal $A_{in}$, applies a dither sequence D to the input signal $A_{in}$ to produce a dithered input signal, and splits the dithered input signal into first and second signal components (at a node $n_1$). It then transmits the first and second signal components through a direct path (via a node $n_2$) and a chopped path (via a node $n_3$), respectively. In the chopped path, the second signal component is modified using a chopping sequence C. Finally, input stage 205 recombines the first and second signal components to produce a composite signal (at a node $n_4$).

ADC slices 210 digitize the composite signal in an alternating fashion (e.g., round robin) to produce corresponding digital signals. Calibration units 215 detect and correct gain and voltage offset errors in the digital signals output by ADC slices 210, based on dither sequence D and chopping sequence C. Through the collective operation of input stage 205, ADC slices 210, and calibration units 215, ADC 200 samples input signal $A_{in}$ with an effective sampling rate of $f_s = N \cdot f_{Slice}$, where N is the number of ADC slices 210 and $f_{Slice}$ is the sampling rate of each ADC slice.

In FIG. 2, inter-slice interleaving offset and gain errors for an ADC slice "i" are represented by equivalent input referred offsets $o_i$ and gains $g_i$ where $i \in 0 \ldots N-1$. The input analog signal $A_{in} = x$, which comprises a time-varying part s and time-invariant part S, is digitized by ADC 200 to produce a digital output $D_{out} = y$. The composition of analog input signal $A_{in}$ is represented by the following equation (1).

$$A_{in} = x = s + S \tag{1}$$

Time-invariant part S can be either an intentional (i.e., not noise) component of the signal x at 0 Hz or a signal that is a sub-harmonic of the overall sampling frequency aliased back to 0 Hz at the input of the ADC slice. Time-invariant part S should be preserved at the output of ADC 200 and should not disrupt calibration. A pseudo-random number generator (PRNG) is used to digitally generate dither sequence D and chopping sequence C. Respective mean and cross correlation values of the dither and the chopping sequences are bounded and made small enough for correct operation by appropriate choice of a pseudo-random generator polynomial and by appropriate choice of integration length used in calibration. The mean and cross correlation of these sequences are assumed to be zero to simplify analysis. The expected value/mean of the input signal x is time-invariant part S, as represented by the following equation (2).

$$E\{C\} \approx 0;\ E\{D\} \approx 0;\ E\{C \cdot D\} \approx 0;\ E\{x\} = E\{s + S\} = S \tag{2}$$

The pseudo-random dither and chopping sequences are considered to be independent of the applied input signal, as illustrated by the following equation (3).

$$E\{C \cdot (s+S)\} = E\{C\} \cdot E\{s+S\} \approx 0 \cdot S \approx 0; \quad E\{D \cdot (s+S)\} = E\{D\} \cdot E\{s+S\} \approx 0 \cdot S \approx 0 \tag{3}$$

In FIG. 2, the labels $n_1$ through $n_{20}$ denote various nodes of ADC 200. For convenience these same labels may alternatively denote signals apparent at the labeled locations, especially when used in equations. The sense in which the labels are used will be apparent from the applicable context. Nodes $n_1 \ldots n_4$ are in input stage 205, node $n_5$ is a digital output of the interleaved ADC slice "i" under consideration. Nodes $n_6 \ldots n_{20}$ are digital signals in calibration units 215.

A dither digital-to-analog converter (DAC) with an equivalent analog gain $g_{Ad}$ converts dither sequence D to an analog signal $g_{Ad} \cdot D$ that is added to input signal x. Accordingly, the signal at node $n_1$ can be represented by the following equation (4).

$$n_1 = x + g_{Ad} \cdot D = s + S + g_{Ad} \cdot D \tag{4}$$

The signal at $n_1$ is split to the direct path, which is represented by gain $a_d$, and the chopped path, which is represented by gain $a_c$. The signals at nodes $n_2$ and $n_3$ can be represented by the following equations (5) and (6).

$$n_2 = a_d \cdot (s + S + g_{Ad} \cdot D) \tag{5}$$

$$n_3 = C \cdot a_c \cdot (s + S + g_{Ad} \cdot D) \tag{6}$$

Note that $a_c$ and $a_d$ add nominally to unity i.e. the signal after adding the direct and the chopped signal does not exceed the full-scale of the rest of the signal path and the ADC slices. This is not a hard requirement for correct operation but a consideration for practical design. Calibration units 215, as explained in further detail below, keep track of the ratio of the gain in the chopped signal path to the gain in the direct signal path. The direct and the chopped signal paths are added to form a signal at $n_4$ and this signal is de-interleaved to the input of the slices. The signal at $n_4$ can be represented by the following equation (7).

$$n_4 = C \cdot a_c \cdot (s + S + g_{Ad} \cdot D) + a_d \cdot (s + S + g_{Ad} \cdot D) = (a_d + C \cdot a_c) \cdot (s + S + g_{Ad} \cdot D) \tag{7}$$

Ignoring quantization effects, circuit noise and other ADC non-idealities, the signal passes through the ADC slice "i" with an input referred offset $o_i$ and input referred gain $g_i$. The digital output of ADC slice "i", at node $n_5$, can be represented by the following equation (8).

$$n_5 = g_i \cdot (a_d + C \cdot a_c) \cdot (s + S + g_{Ad} \cdot D) + o_i \tag{8}$$

All of the signals beyond node $n_5$ are digital. Assume that a digital offset correction coefficient $o_{ci}$, estimated by an adaptive least mean squares (LMS) algorithm LMS$_o$, is added to the signal path to generate a signal at node $n_6$ such that interleaving slice dependent offset error is suppressed. It will be seen that the LMS loop will drive $o_i + o_{ci}$ to 0. The signal at node $n_6$ can be represented by the following equation (9).

$$n_6 = g_i \cdot (a_d + C \cdot a_c) \cdot (s + S + g_{Ad} \cdot D) + (o_i + o_{ci}) \tag{9}$$

The signal at node $n_6$ is chopped digitally using the same chopping sequence C to obtain signal at node $n_7$, which is represented by the following equation (10). Note that repeating the chopping operation reverses the chopping effect i.e. $C^2=1$.

$$n_7 = C \cdot g_i \cdot (a_d + C \cdot a_c) \cdot (s + S + g_{Ad} \cdot D) + C \cdot (o_i + o_{ci}) = g_i \cdot (C \cdot a_d + a_c) \cdot (s + S + g_{Ad} \cdot D) + C \cdot (o_i + o_{ci}) \quad (10)$$

Signals $n_6$ and $n_7$ are averaged by integrators $S_{do}$ and $S_{co}$ over an integration length that depends on the accuracy of convergence required to generate average signals at nodes $n_{13}$ and $n_{12}$, respectively. The function E{.} represents an estimated expected value (average) over an integration period of the integrator. The signals at respective nodes $n_{13}$ and $n_{12}$ can be represented by the following equations (11) and (12).

$$n_{13} = E\{n_6\} = E\{g_i \cdot (a_d + C \cdot a_c) \cdot (s + S + g_{Ad} \cdot D) + (o_i + o_{ci})\} = g_i \cdot a_d \cdot S + (o_i + o_{ci}) \quad (11)$$

$$n_{12} = E\{n_7\} = E\{g_i \cdot (C \cdot a_d + a_c) \cdot (s + S + g_{Ad} \cdot D) + C \cdot (o_i + o_{ci})\} = g_i \cdot a_c \cdot S \quad (12)$$

The signal at node $n_{12}$ contains information about the time-invariant part S and the signal at node $n_{13}$ contains information about both the time-invariant part S and the input referred offset $o_i$ of the slice. A digital coefficient $q_{ci}$ (also computed by an LMS algorithm) tracks the ratio of the gain in the chopped and direct path, and it allows the signal at node $n_{13}$ to be scaled to form $n_{14}$ such that the time-invariant part of the signal can be canceled, as represented by the following equation (13).

$$n_{14} = q_{ci} \cdot n_{13} = q_{ci} \cdot (g_i \cdot a_d \cdot S + (o_i + o_{ci})) = q_{ci} \cdot g_i \cdot a_d \cdot S + q_{ci} \cdot (o_i + o_{ci}) \quad (13)$$

The signal at node $n_{14}$ is added to the signal at node $n_{12}$ to produce the signal at node $n_{15}$, which represents the error input that drives the LMS algorithm $LMS_o$. The signal at node $n_{15}$ can be represented by the following equation (14).

$$n_{15} = n_{12} + n_{14} = g_i \cdot a_c \cdot S + q_{ci} \cdot g_i \cdot a_d \cdot S + q_{ci} \cdot (o_i + o_{ci}) = g_i \cdot (q_{ci} \cdot a_d + a_c) \cdot S + q_{ci} \cdot (o_i + o_{ci}) \quad (14)$$

The LMS algorithm $LMS_o$ with a step size $\mu_o$ adaptively tunes coefficient $o_{ci}$ between successive iterations 'k' and 'k+1' according to the following equation (15).

$$o_{ci}[k+1] = o_{ci}[k] + \mu_o \cdot n_{15} = o_{ci}[k] + \mu_o \cdot (g_i \cdot (q_{ci} \cdot a_d + a_c) \cdot S + q_{ci} \cdot (o_i + o_{ci})) \quad (15)$$

Assuming that $q_{ci}$ can be arranged (using LMS algorithm $LMS_q$) to converge to $-a_c/a_d$ then the first part of the error input goes to zero. The LMS algorithm $LMS_o$ now operates on the second part of the error input $(o_i + o_{ci})$, which in this case is the residual offset error and converges when this error is nulled i.e. forces coefficient $o_{ci} \approx -o_i$ thereby canceling the slice input referred offset at node $n_6$.

Digital coefficient $q_{ci}$ is designed to track the ratio of the signal chopped relative to the direct signal and scales the chopped signal at node $n_7$ to obtain scaled chopped signal at node $n_8$, as represented by the following equation (16).

$$n_8 = q_{ci} \cdot n_7 = q_{ci} \cdot g_i \cdot (C \cdot a_d + a_c) \cdot (s + S + g_{Ad} \cdot D) + q_{ci} \cdot C \cdot (o_i + o_{ci})$$

The direct and the scaled chopped signals are combined to obtain a signal at $n_9$, as represented by the following equations (17) and (18).

$$n_9 = n_6 + n_8 = g_i \cdot (a_d + C \cdot a_c) \cdot (s + S + g_{Ad} \cdot D) + (o_i + o_{ci}) + q_{ci} \cdot g_i \cdot (C \cdot a_d + a_c) \cdot (s + S + g_{Ad} \cdot D) + q_{ci} \cdot C \cdot (o_i + o_{ci}) \quad (17)$$

$$n_9 = g_i \cdot (a_d + q_{ci} \cdot a_c) \cdot (s + S + g_{Ad} \cdot D) + g_i \cdot C \cdot (q_{ci} \cdot a_d + a_c) \cdot (s + S + g_{Ad} \cdot D) + (1 + q_{ci} \cdot C) \cdot (o_i + o_{ci}) \quad (18)$$

The signal at node $n_9$ comprises of three parts, a direct signal (desired), a chopped signal (containing information about the gain in the chopped path) and a residual offset (which will be nulled by the offset cancellation procedure $LMS_o$). The signal at node $n_9$ is now correlated with the chopped dither i.e. multiplied by chop and dither (signal at node $n_{16}$) and subsequently integrated using integrator $S_{cg}$ to obtain the error signal at node $n_{17}$ that drives the LMS algorithm $LMS_q$. The signals at nodes $n_{16}$ and $n_{17}$ can be represented by the following equations (19) and (20).

$$n_{16} = C \cdot D \cdot n_9 = C \cdot D \cdot g_i \cdot (a_d + q_{ci} \cdot a_c) \cdot (s + S + g_{Ad} \cdot D) + g_i \cdot D \cdot (q_{ci} \cdot a_d + a_c) \cdot (s + S + g_{Ad} \cdot D) + C \cdot D \cdot (1 + q_{ci} \cdot C) \cdot (o_i + o_{ci}) \quad (19)$$

$$n_{17} = E\{n_{16}\} = g_i \cdot g_{Ad} \cdot E\{D^2\} \cdot (q_{ci} \cdot a_d + a_c) \quad (20)$$

In equation (20), $E\{D^2\}$ represents the variance of the dither sequence and is a constant for a given design. The LMS algorithm $LMS_q$ with a step size $\mu_q$ adaptively tunes coefficient $q_{ci}$ from iteration 'k' to 'k+1' according to the following equation (21).

$$q_{ci}[k+1] = q_{ci}[k] + \mu_q \cdot n_{17} = q_{ci}[k] + \mu_q \cdot g_i \cdot g_{Ad} \cdot E\{D^2\} \cdot (q_{ci} \cdot a_d + a_c) \quad (21)$$

This converges by nulling the term $(q_{ci} \cdot a_d + a_c)$ i.e. where $q_{ci} \approx -a_c/a_d$. This coefficient tracks the ratio of signal in the chopped path and the direct path and also validates the assumption made while nulling the offset coefficient using $LMS_o$. Where LMS loops $LMS_o$ and $LMS_q$ converge, the signal at node $n_9$ will be free of slice offset error and chopped dither i.e. only the direct dither remains in the signal, as indicated by the following equation (22).

$$n_{9(Converge)} \approx g_i \cdot (a_d - a_c^2/a_d) \cdot (s + S + g_{Ad} \cdot D) \quad (22)$$

Let coefficient $g_d$ scale the dither to approximately match the analog equivalent gain of the dither path i.e. $g_d \approx g_{Ad}$. Under these conditions, a signal at node $n_{18}$ is represented by the following equation (23).

$$n_{18} = g_d \cdot D \quad (23)$$

Digital coefficient $h_{ci}$ is designed to remove the residual direct (un-chopped) dither. Because the dither was injected at a point common to all slices, this has the added benefit of aligning all the slices to have the same gain i.e. eliminates the inter-slice gain error. Under these conditions, a signal at node $n_{10}$ is represented by the following equation (24).

$$n_{10} = h_{ci} \cdot n_9 = h_{ci} \cdot g_i \cdot (a_d + q_{ci} \cdot a_c) \cdot (s + S + g_{Ad} \cdot D) + h_{ci} \cdot g_i \cdot C \cdot (q_{ci} \cdot a_d + a_c) \cdot (s + S + g_{Ad} \cdot D) + h_{ci} \cdot (1 + q_{ci} \cdot C) \cdot (o_i + o_{ci}) \quad (24)$$

Digitally subtracting the dither at node $n_{11}$ results in a signal as represented by the following equations (25)-(27).

$$n_{11} = n_{10} - n_{18} \quad (25)$$

$$n_{11} = h_{ci} \cdot g_i \cdot (a_d + q_{ci} \cdot a_c) \cdot (s + S + g_{Ad} \cdot D) - g_d \cdot D + h_{ci} \cdot g_i \cdot C \cdot (q_{ci} \cdot a_d + a_c) \cdot (s + S + g_{Ad} \cdot D) + h_{ci} \cdot (1 + q_{ci} \cdot C) \cdot (o_i + o_{ci}) \quad (26)$$

$$n_{11} = h_{ci} \cdot g_i \cdot (a_d + q_{ci} \cdot a_c) \cdot (s + S) + (h_{ci} \cdot g_i \cdot g_{Ad} - g_d) \cdot (a_d + q_{ci} \cdot a_c) \cdot D + h_{ci} \cdot g_i \cdot C \cdot (q_{ci} \cdot a_d + a_c) \cdot (s + S + g_{Ad} \cdot D) + h_{ci} \cdot (1 + q_{ci} \cdot C) \cdot (o_i + o_{ci}) \quad (27)$$

The signal at node $n_{11}$ can be interpreted as having four parts. The first part is the desired signal without the dither, the second part contains the residual direct dither (also contains information about the inter-slice gain), the third part is the residual chopped signal and dither (nulled by $LMS_q$) and the fourth part is the residual inter-slice offset (nulled by $LMS_o$). This signal is correlated with the dither i.e. multiplied with the dither D (signal at node $n_{19}$) and averaged using integrator $S_{dg}$ to obtain the error signal at node $n_{20}$ that drives the LMS algorithm $LMS_g$, as represented by the following equations (28) and (29).

$$n_{19}=D \cdot n_{11}=h_{ci} \cdot g_i \cdot (a_d+q_{ci} \cdot a_c) \cdot (s+S) \cdot D+(h_{ci} \cdot g_i \cdot g_{Ad}-g_d) \cdot$$
$$(a_d+q_{ci} \cdot a_c) \cdot D^2+h_{ci} \cdot g_i \cdot C \cdot (q_{ci} \cdot a_d+a_c) \cdot (s+S+$$
$$g_{Ad} \cdot D) \cdot D+h_{ci} \cdot (1+q_{ci} \cdot C) \cdot (o_i+o_{ci}) \cdot D \qquad (28)$$

$$n_{20}=E\{n_{19}\}=(h_{ci} \cdot g_i \cdot g_{Ad}-g_d) \cdot (a_d+q_{ci} \cdot a_c) \cdot E\{D^2\} \qquad (29)$$

The LMS algorithm $LMS_g$ with a step size $\mu_g$ adaptively tunes coefficient $h_{ci}$ from iteration 'k' to 'k+1' according to the following equation (30).

$$h_{ci}[k+1]=h_{ci}[k]+\mu_g \cdot n_{20}=h_{ci}[k]+\mu_g \cdot E\{D^2\} \cdot (a_d+q_{ci} \cdot a_c) \cdot$$
$$(h_{ci} \cdot g_i \cdot g_{Ad}-g_d) \qquad (30)$$

The algorithm updates $h_{ci}$ and converges when the error term $(h_{ci} \cdot g_i \cdot g_{Ad}-g_d)$ is nulled i.e. converges when $h_{ci} \approx g_d/(g_i \cdot g_{Ad})$. Because $g_{Ad} \approx g_d$, the coefficient is approximately equal to the input-referred gain of the slice. Because $g_{AD}$ is an analog gain common to all slices and $g_d$ is a digital gain that is accurate across all slices, the coefficient $h_{ci}$ serves to equalize the inter-slice gain (gets rid of inter-slice gain error) and also removes the added dither. Thus the output of the DSP block $D_{out}$ can be expressed by the following equation (31).

$$D_{out}=y=n_{11}=h_{ci} \cdot g_i \cdot (a_d+q_{ci} \cdot a_c) \cdot (s+S) \leftarrow \text{Desired signal+}$$
$$(h_{ci} \cdot g_i \cdot g_{Ad}-g_d) \cdot (a_d+q_{ci} \cdot a_c) \cdot D \leftarrow \text{At convergence:}$$
$$LMS_g \text{ sets } hci \approx g_d/(g_i \cdot g_{Ad})+h_{ci} \cdot g_i \cdot C \cdot (q_{ci} \cdot a_d+a_c) \cdot (s+$$
$$S+g_{Ad} \cdot D) \leftarrow \text{At convergence: } LMS_q \text{ sets } q_{ci} \approx -a_c/$$
$$a_d+h_{ci} \cdot (1+q_{ci} \cdot C) \cdot (o_i+o_{ci}) \leftarrow \text{At convergence:}$$
$$LMS_o \text{ sets } o_{ci} \approx -o_i D_{out}=g_d/g_{Ad}(a_d-a_c^2/a_d) \cdot (s+S)+$$
(LMS Convergence related errors that can be made small)

Thus the output is free of inter-slice offset and gain errors $o_i$ and $g_i$ where $i=0 \ldots N-1$.

There is an overall input referred gain common to all slices and this is usually not a problem and can be fixed using a system level calibration. Any offset in the front-end direct path (e.g., the direct path of input stage 105) is common to all the slices and is also usually not a problem and fixed using a system level calibration. Any offset in the front-end chopped path is common to all the slices and is corrected by the offset calibration LMS loop and does not cause spurs. The adaptive LMS correction algorithm with one loop for each coefficient is being used for illustration because it is relatively easy to understand. In alternative embodiments, this could be implemented using any other adaptive algorithm (e.g., RLS, sign-sign LMS etc.) and can also be implemented in matrix or multiple-input multiple-coefficient form. Both the time-varying and time-invariant portions of the signal are conserved at the output and the calibration method is not affected by the time-invariant part of the signal hence any signal that lies within the full-scale range of the ADC or an absence of valid input signal does not prevent correct operation of the calibration algorithm.

ADC 200, as illustrated in FIG. 2, uses several multipliers and integrators/accumulators/correlators but this hardware is potentially smaller than the hardware required to implement a conventional thermal tail correction filter. In addition, the amount of partial chopping (amount of signal in the direct versus the chopped path) can be made programmable in the analog domain so that scenarios can be tested in the actual system that allows the designer to trade off the amount of residual chopped thermal tail to be reduced by a digital filter versus spurs during calibration transients.

A potential shortcoming of the partial chopping approach over a full signal path chopping approach is that when the calibration coefficients have not fully settled, any residual inter-slice offset may appear both as frequency domain spur and broadband noise, which progressively reduce to acceptable values as calibration coefficients converge to the final value. On the other hand, in the full signal path chopping approach, any residual inter-slice offset just manifests as broadband noise that reduces as the offset coefficient converges. This may not be a problem because this behavior is exhibited during the initial hunting transient. Time constants of the calibration loops can be set such that this is not a problem during calibration loop tracking transients. Another potential shortcoming is that the direct path may have a slightly smaller gain due to part of the signal range being used for partial chopping. This may cause the SNR due to circuit noise to be slightly worse, however this can be budgeted and the circuits can be appropriately designed such that this does not impact the overall performance of the ADC.

Figure 3:
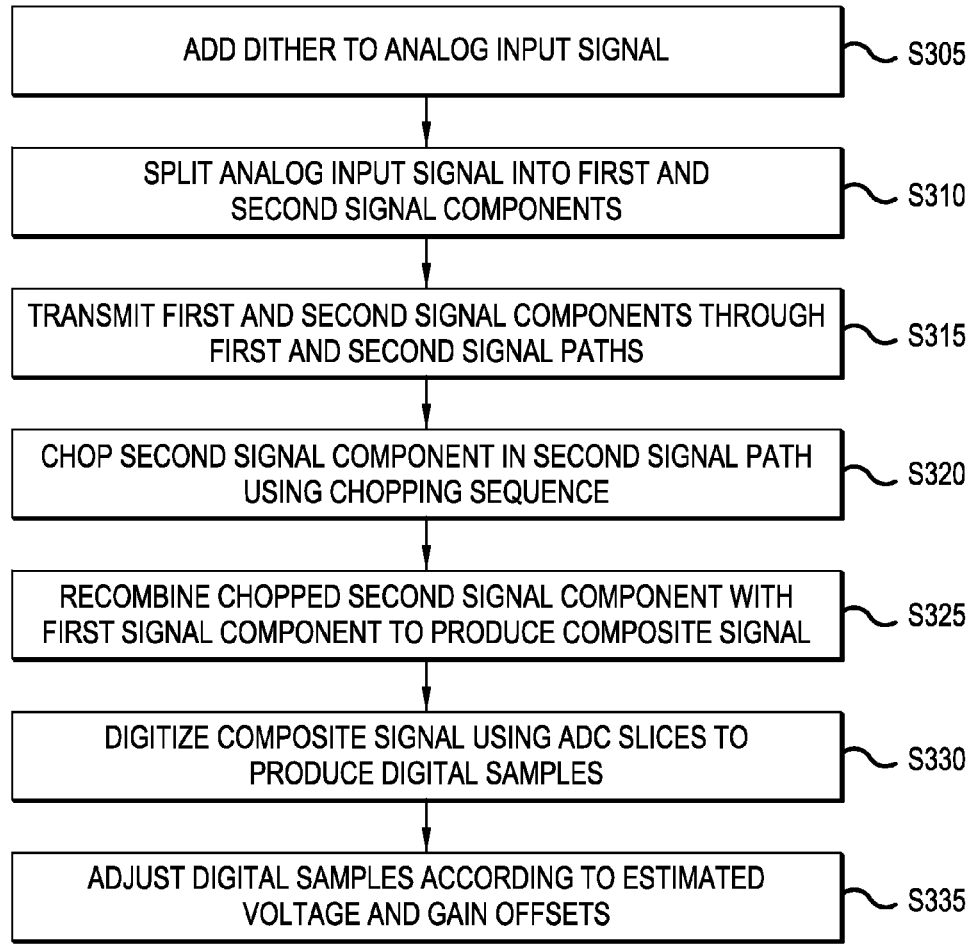
FIG. 3 is a flowchart illustrating a method of operating an interleaved ADC to perform gain and voltage offset calibration using a partial chopping approach according to a representative embodiment.

FIG. 3 is a flowchart illustrating a method of operating an interleaved ADC to perform gain and voltage offset calibration using a partial chopping approach according to a representative embodiment.

Referring to FIG. 3, the method comprises adding a dither to an analog input signal based on a dither sequence (S305), then splitting the analog input signal into first and second signal components (S310) and transmitting the respective first and second signal components through a first signal path and a second signal path (S315). The method further comprises chopping the second signal component in the second signal path using a chopping sequence (S320) and recombining the chopped second signal component with the first signal component to produce a composite signal (S325). The method still further comprises digitizing the composite signal using a plurality of ADC slices operating in an alternating fashion (e.g., round robin) to produce a plurality of digital samples (S330) and adjusting the digital samples according to estimated gain and voltage offset errors of the ADC slices determined in relation to the dither sequence and the chopping sequence (S335). The above operations can be performed as described above in relation to ADC 200, although they are not necessarily limited to implementation within such a system.

FIGS. 4 through 6 are graphs illustrating the results of simulations performed with respect to an interleaving ADC using the partial chopping approach described above with reference to FIGS. 2 and 3. In each of the simulations, the interleaving ADC comprises four ADC slices each sampling at a fourth of a desired sampling rate. The offset and gain errors of the ADC slices are varied, and the results of varying the offset and gain errors are shown in the graphs. Quantization noise and other errors were ignored in the simulations.

Figure 4A:
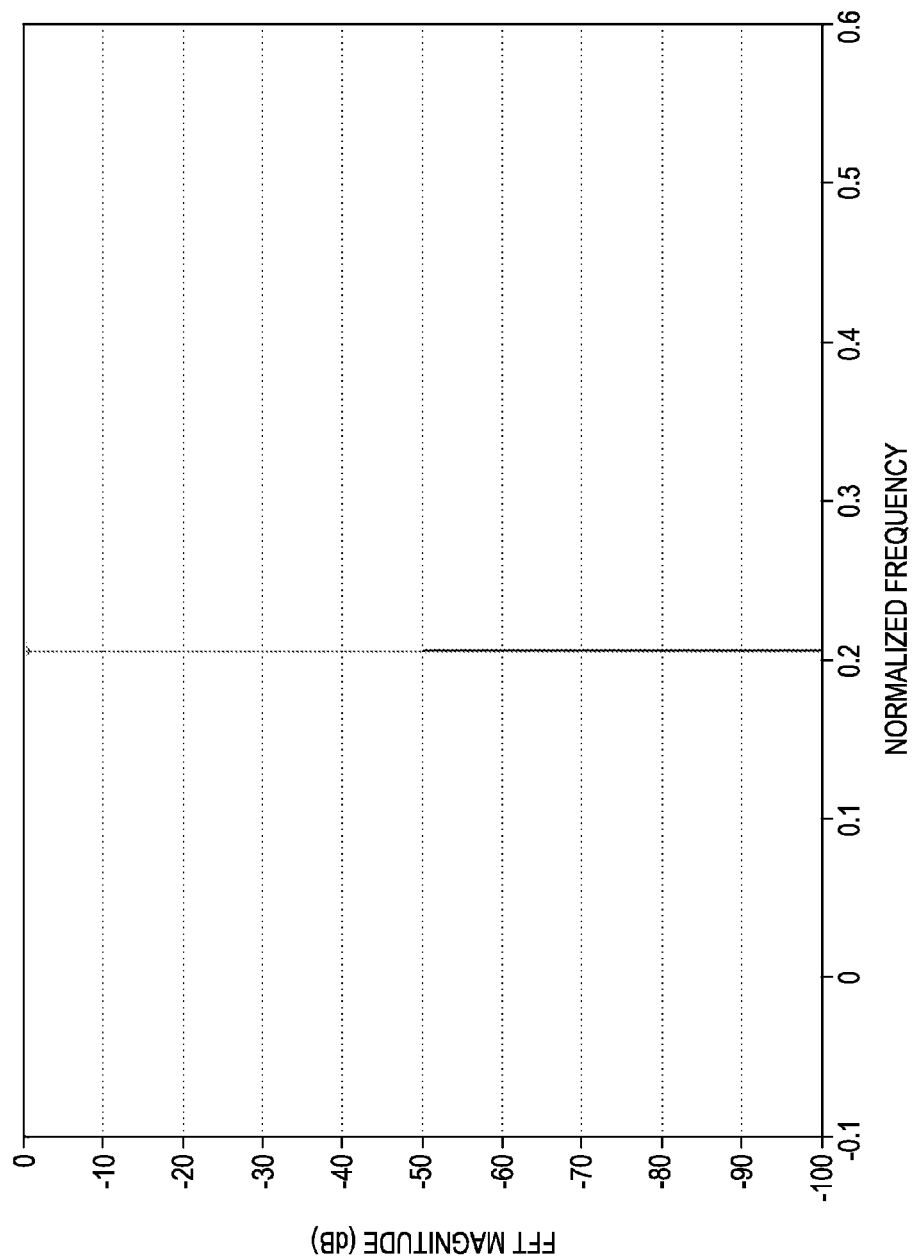
FIG. 4A is a graph illustrating a fast Fourier transform (FFT) spectrum of an output signal of an interleaved ADC that samples a sinusoidal input signal without an intentional component at 0 Hz, without gain or offset errors in its ADC slices.
Figure 4B:
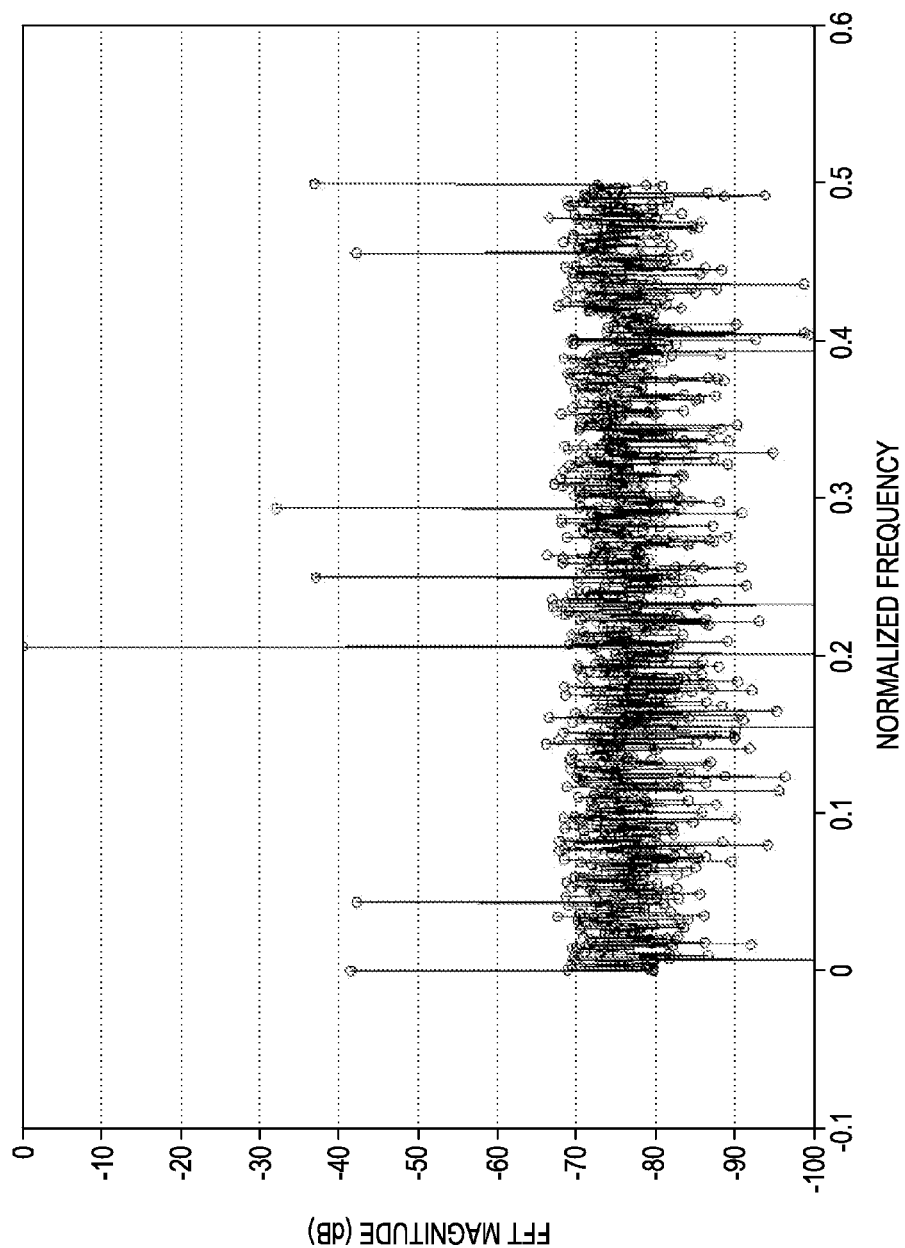
FIG. 4B is a graph illustrating an FFT spectrum of an output signal of the interleaved ADC of FIG. 4A, except with gain and offset errors in its ADC slices and no calibration to remove those errors.
Figure 4C:
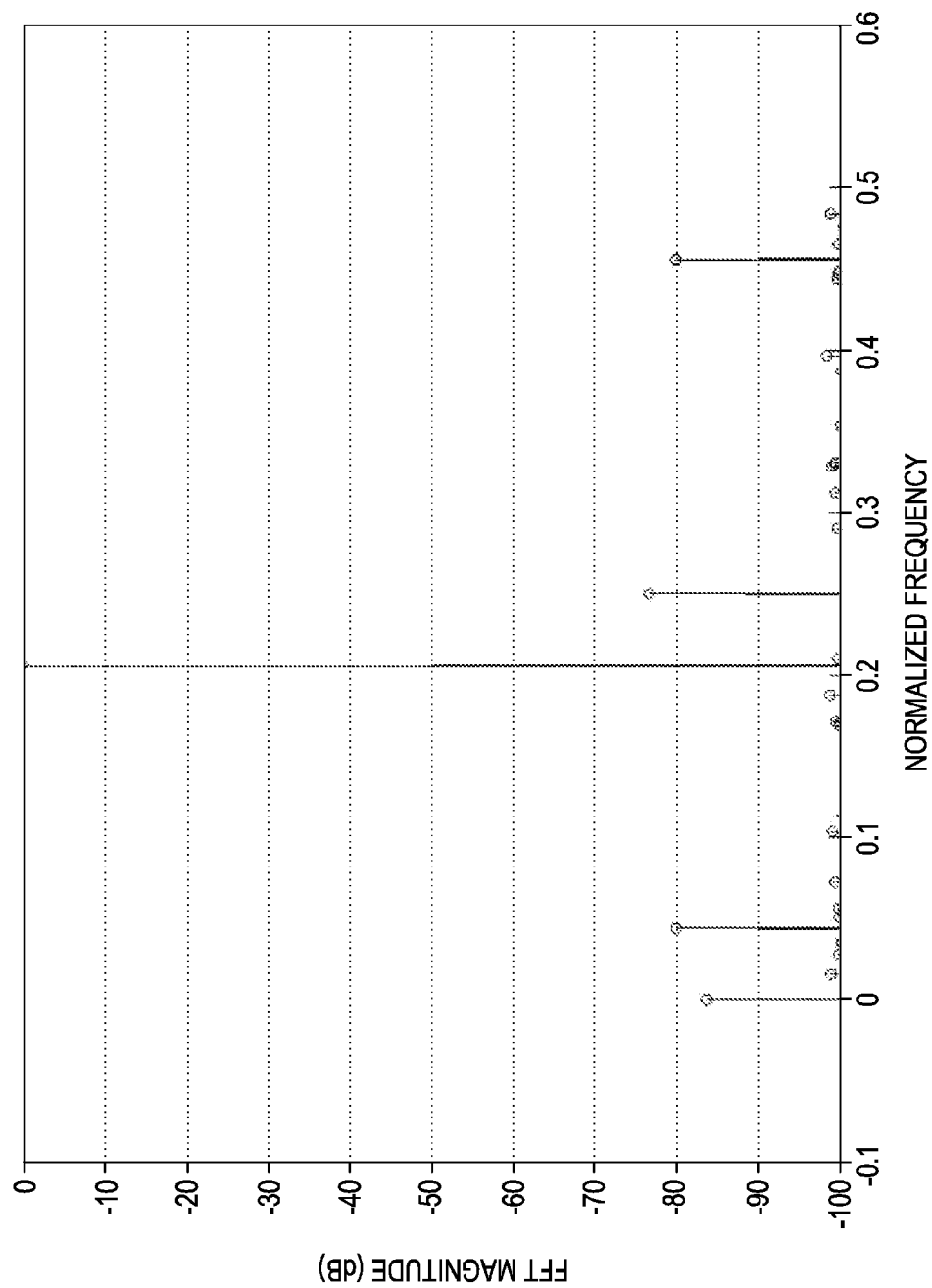
FIG. 4C is a graph illustrating an FFT spectrum of an output signal of the interleaved ADC of FIG. 4A, except with gain and offset errors in its ADC slices, and calibration to remove the errors.

FIGS. 4A through 4C show a 2048 point FFT spectrum of the output of the simulated ADC with a sinusoidal input signal with no intentional component at 0 Hz. FIG. 4A shows the spectrum with no errors. FIG. 4B shows the spectrum with inter-slice offset and gain errors without calibration. As illustrated by FIG. 4B, in the presence of uncompensated interleaving errors, the interleaving spurs and the noise floor are elevated. FIG. 4C shows the spectrum after calibration. As illustrated by the difference between FIG. 4B and FIG. 4C, the interleaving spurs and the noise floor are effectively suppressed to acceptable levels after calibration.

Figure 4D:
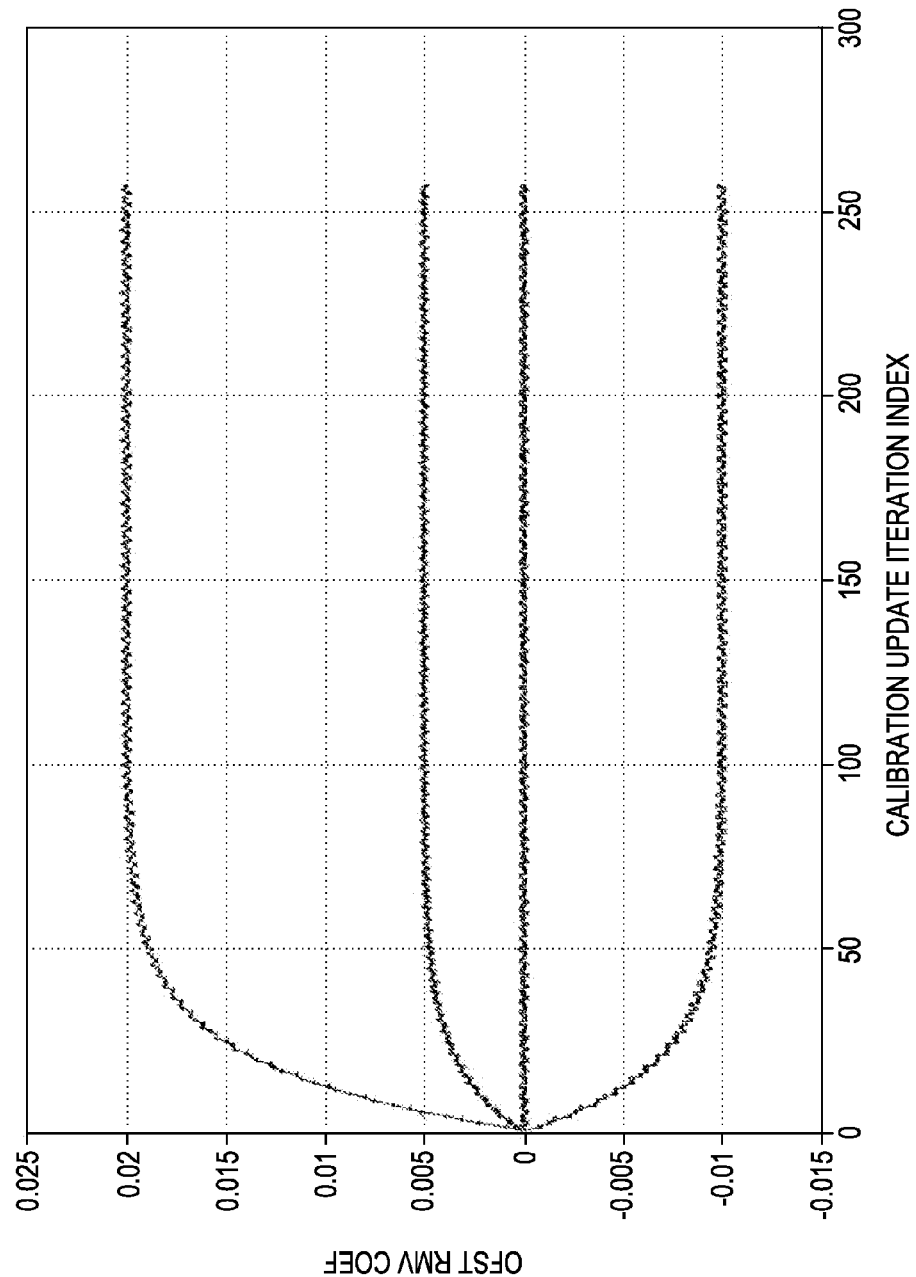
FIG. 4D is a graph illustrating the convergence of a first calibration coefficient for the interleaved ADC of FIG. 4C.
Figure 4E:
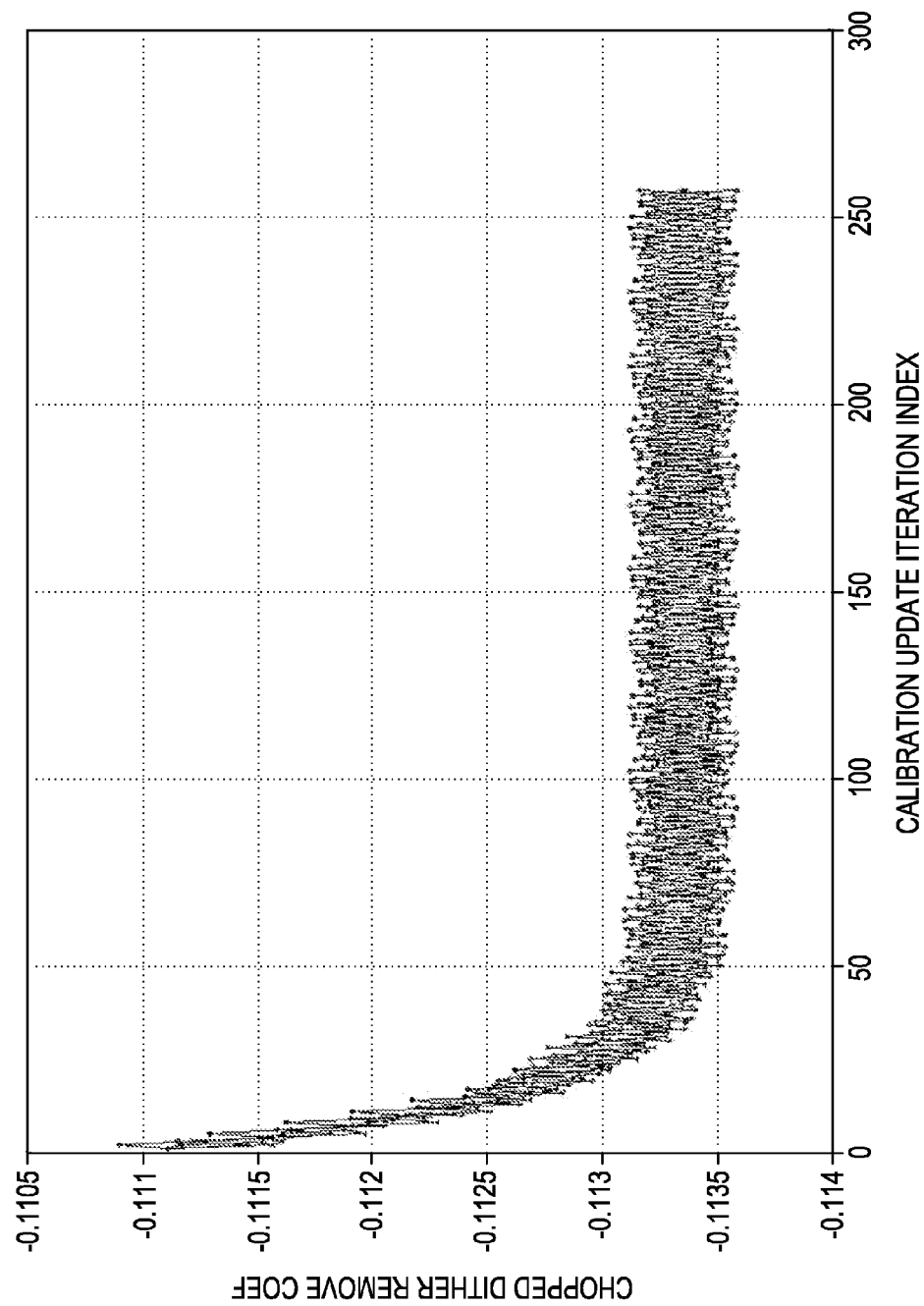
FIG. 4E is a graph illustrating the convergence of a second calibration coefficient for the interleaved ADC of FIG. 4C.
Figure 4F:
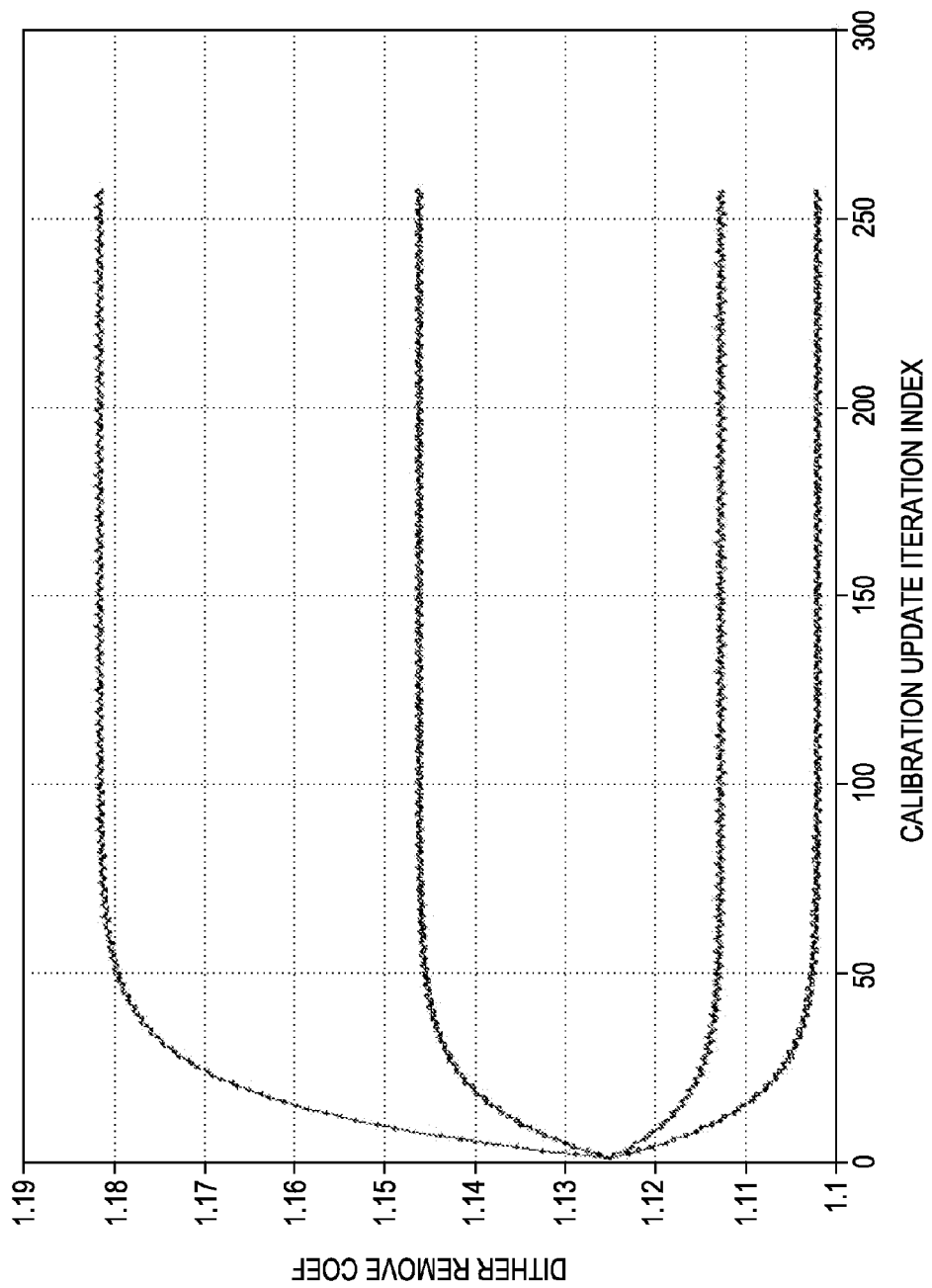
FIG. 4F is a graph illustrating the convergence of a third calibration coefficient for the interleaved ADC of FIG. 4C.

FIGS. 4D through 4F illustrate the convergence of calibration coefficients to values that would mitigate the effects of the inter-slice offset and gain errors. Each of the different curves in FIGS. 4D through 4F represents a different one of the four ADC slices.

Figure 5A:
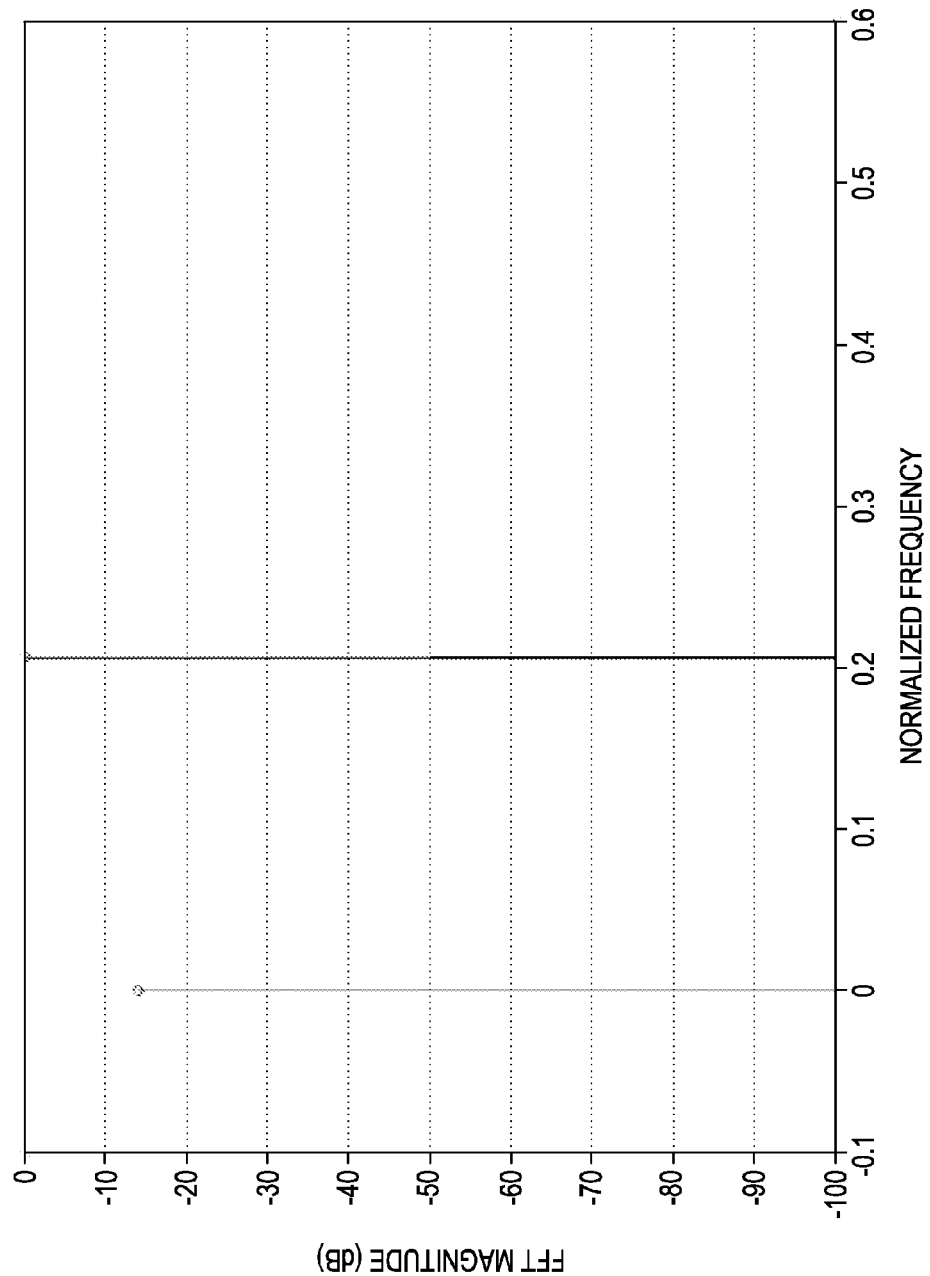
FIG. 5A is a graph illustrating an FFT spectrum of an output signal of an interleaved ADC that samples a sinusoidal input signal with an intentional component at 0 Hz, and without gain or offset errors in its ADC slices.
Figure 5B:
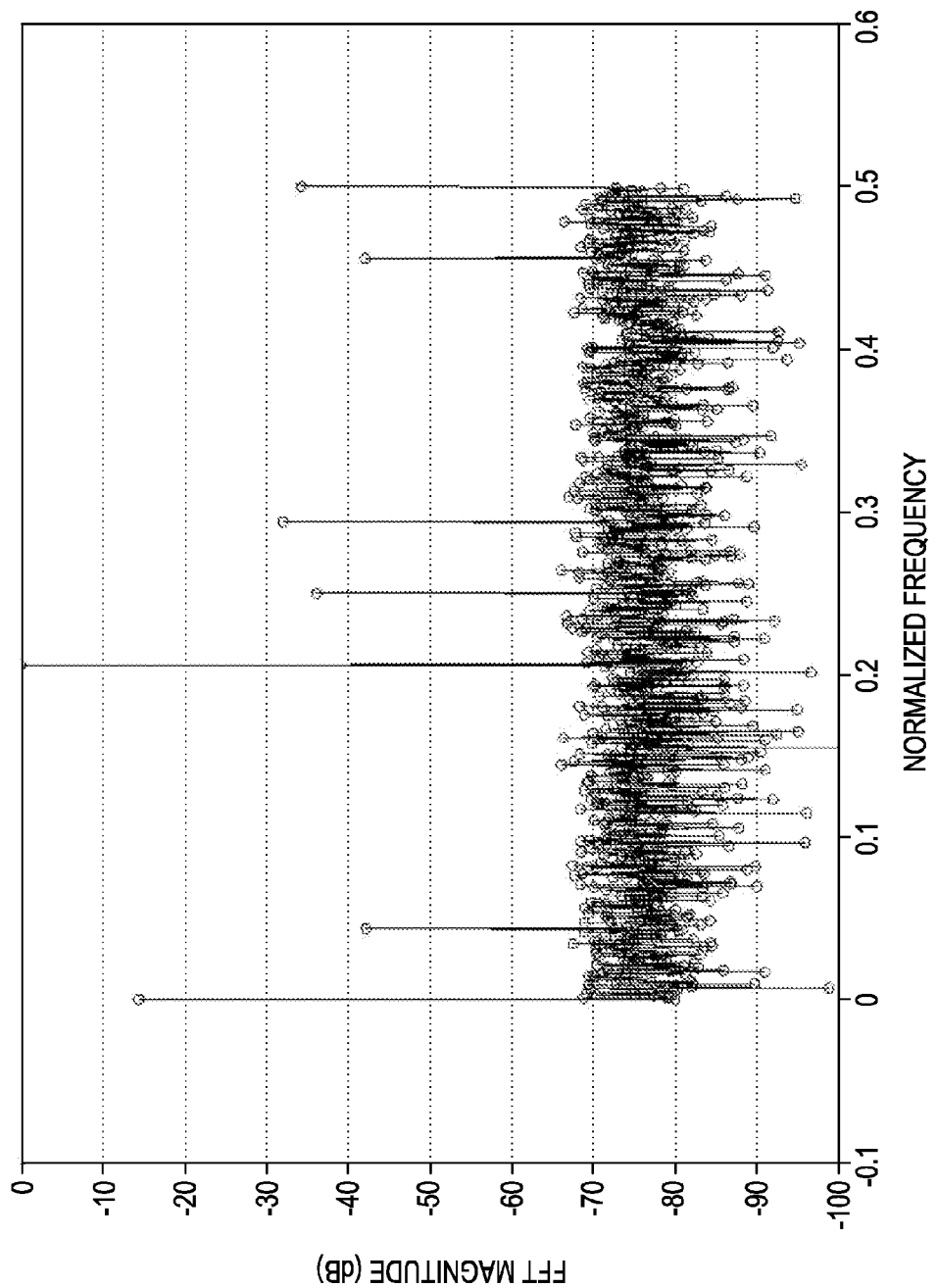
FIG. 5B is a graph illustrating an FFT spectrum of an output signal of the interleaved ADC of FIG. 5A, except with gain and offset errors in its ABC slices and no calibration to remove those errors.
Figure 5C:
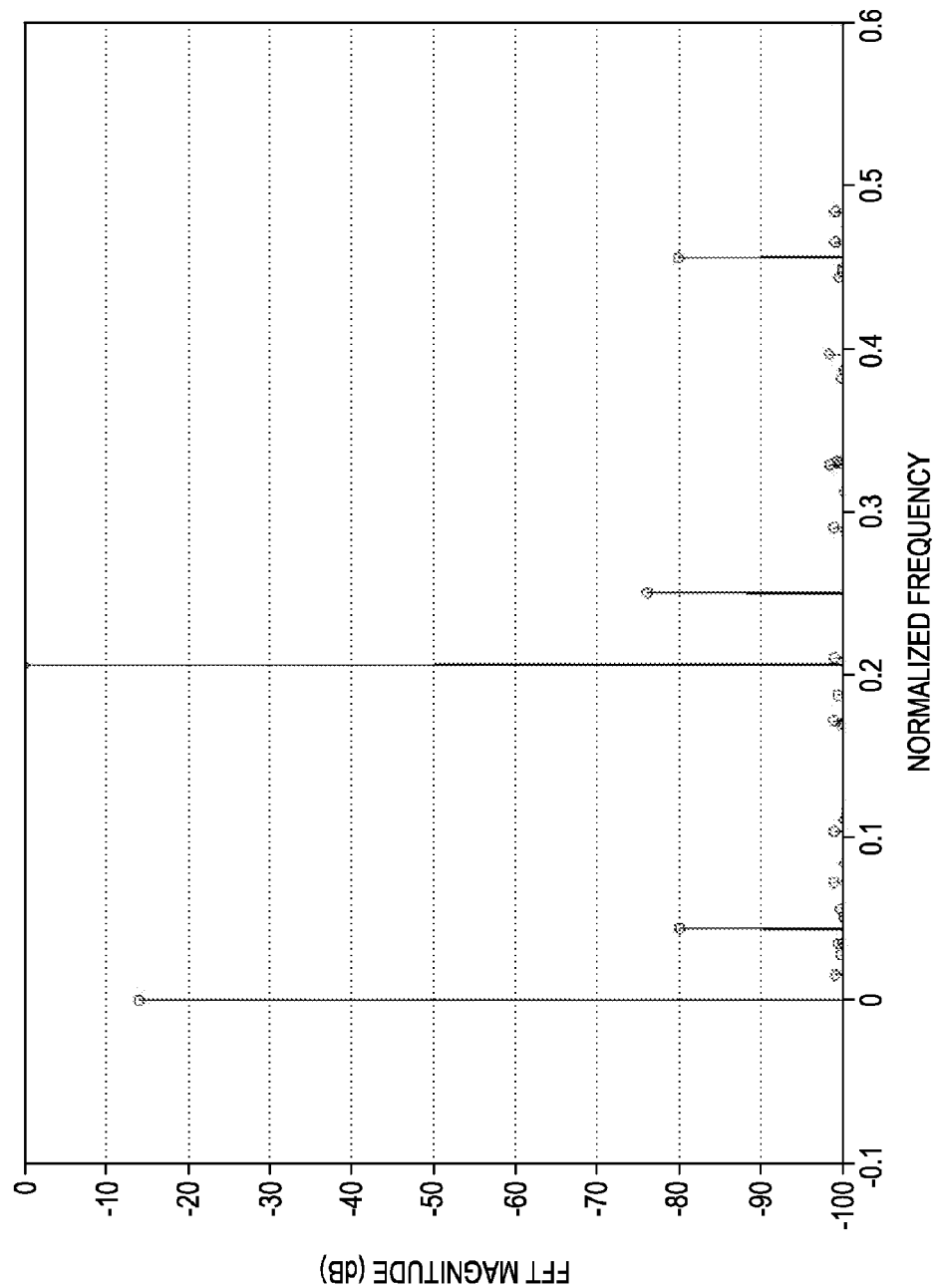
FIG. 5C is a graph illustrating FFT spectrum of an output signal of the interleaved ADC of FIG. 5A, except with gain and offset errors in its ADC slices, and calibration to remove the errors.
Figure 5D:
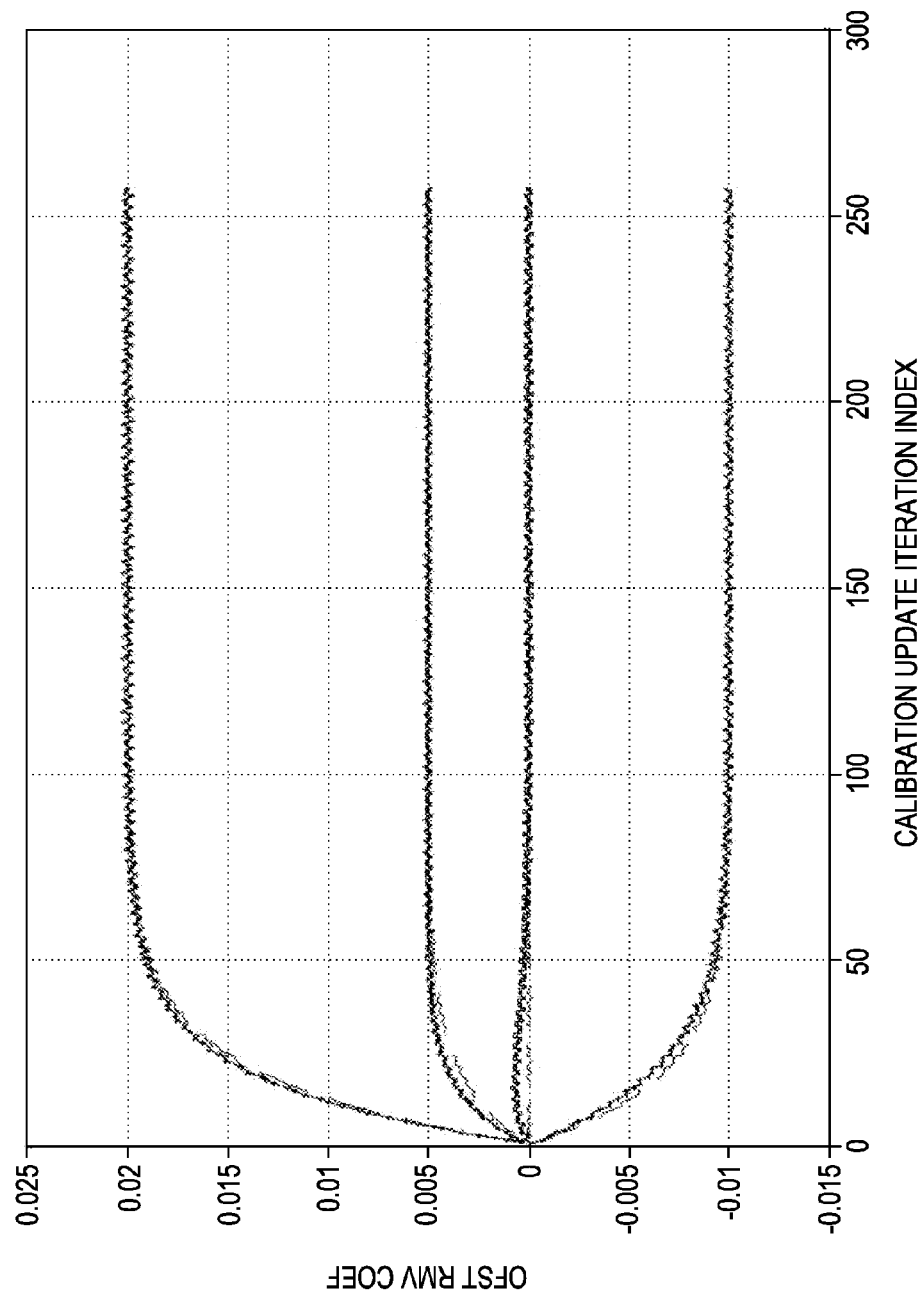
FIG. 5D is a graph illustrating the convergence of a first calibration coefficient for the interleaved ADC of FIG. 5C.
Figure 5E:
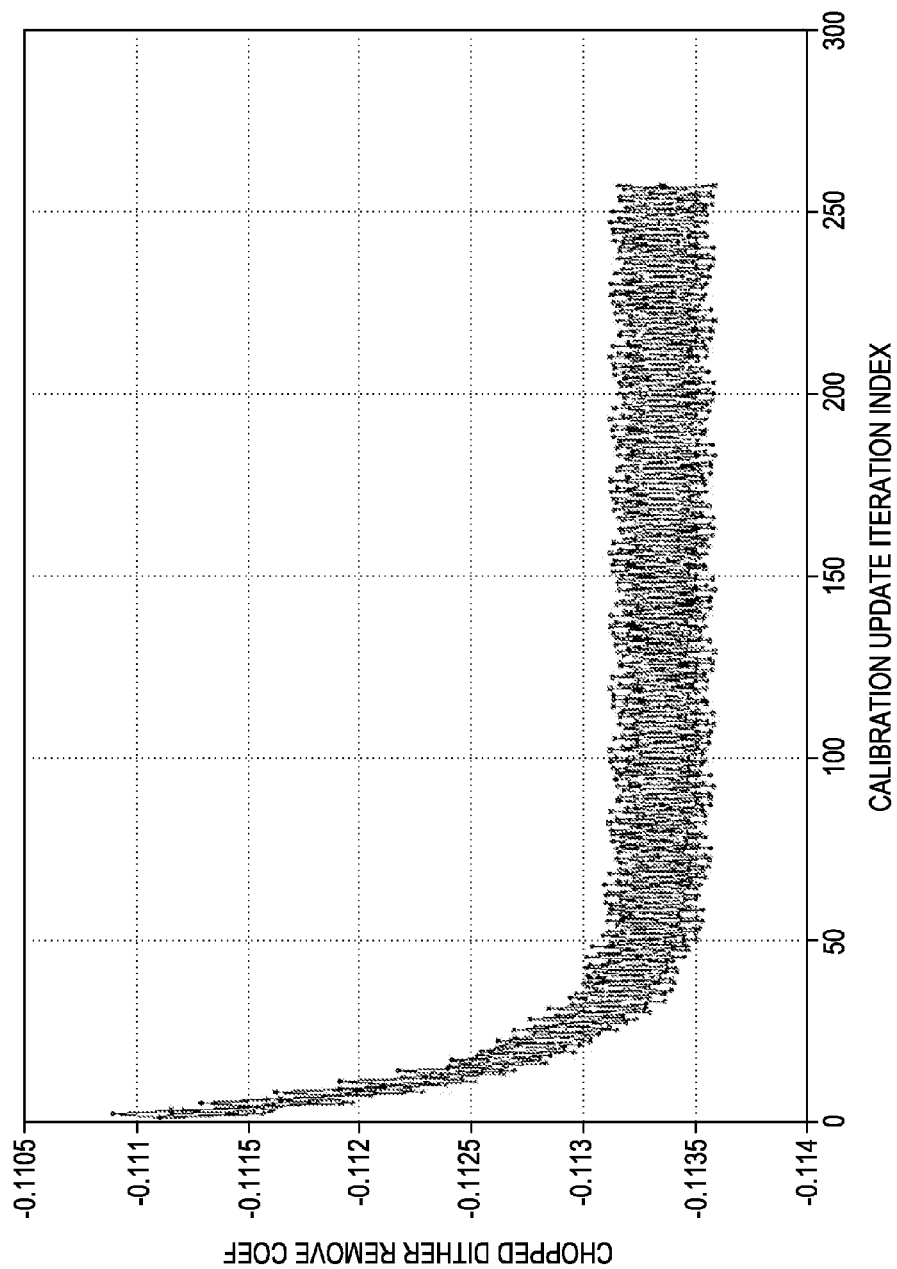
FIG. 5E is a graph illustrating the convergence of a second calibration coefficient for the interleaved ADC of FIG. 5C.
Figure 5F:
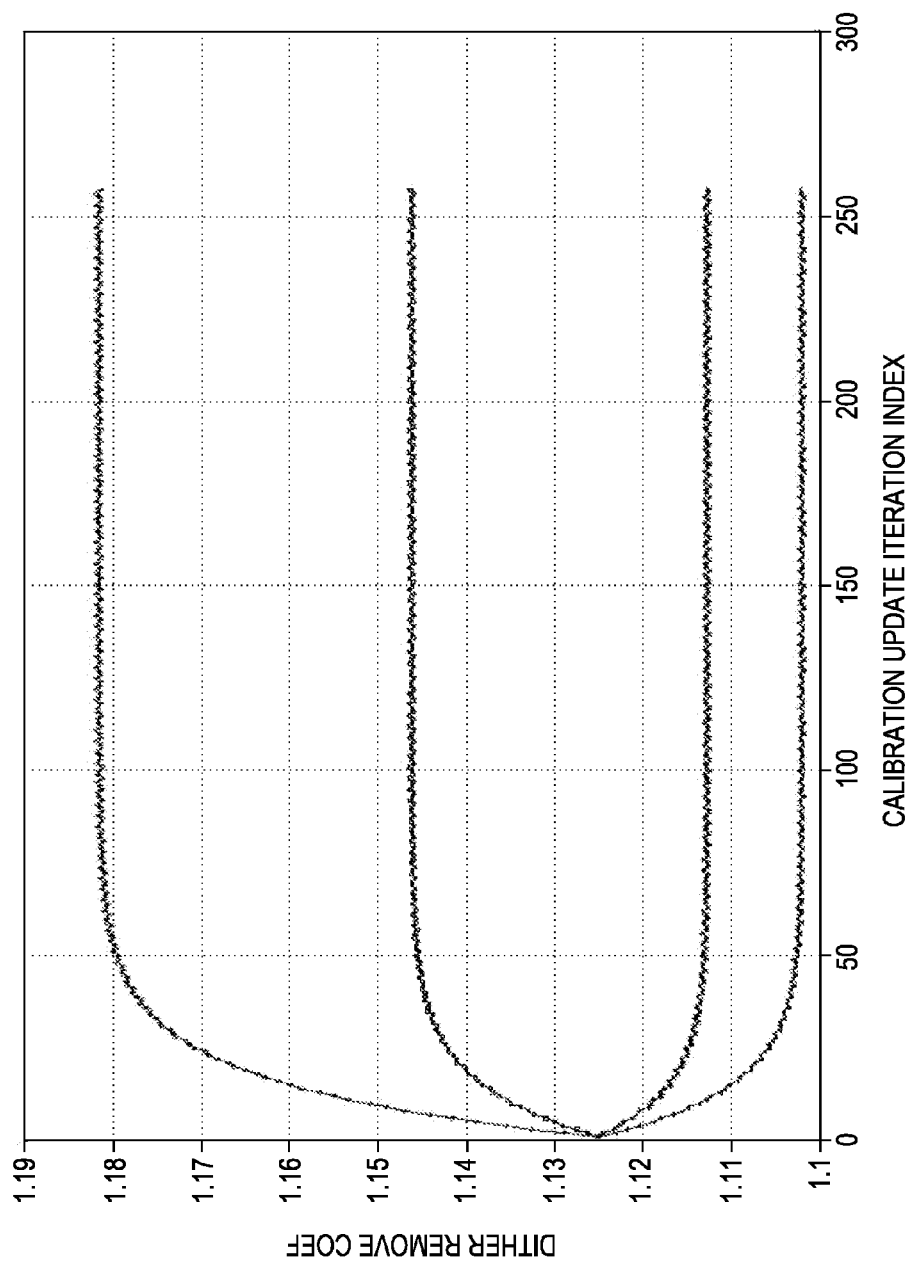
FIG. 5F is a graph illustrating the convergence of a third calibration coefficient for the interleaved ADC of FIG. 5C.

FIGS. 5A through 5C show the results of simulations performed under the same conditions as in FIGS. 4A through 4C, respectively, except that the sinusoidal input signal has an additional intentional component at 0 Hz. As illustrated by FIGS. 5D through 5F, the coefficients converge to the same values as in FIGS. 4D through 4F, indicating that the calibration is robust to the presence of changes in the input signal.

Figure 6B:
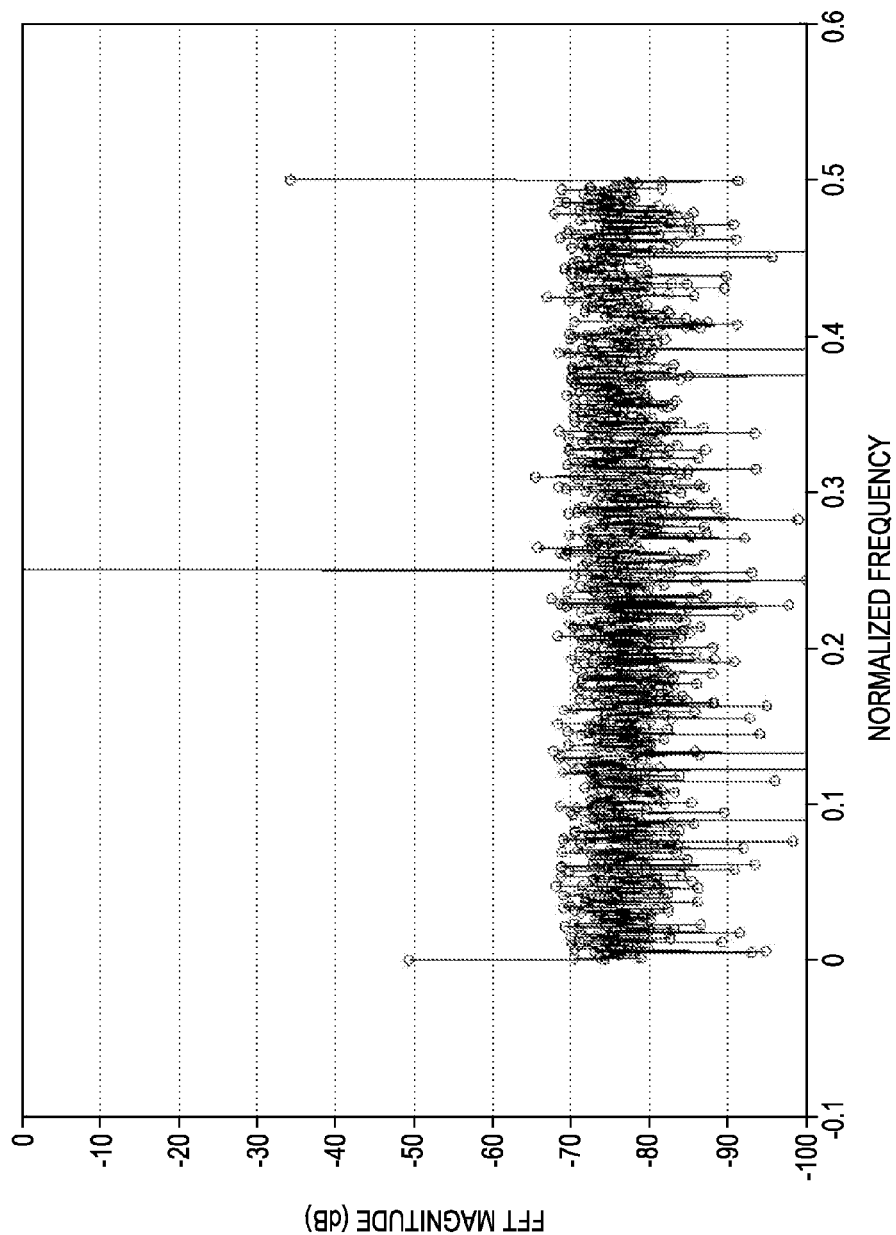
FIG. 6B is a graph illustrating an FFT spectrum of an output signal of the interleaved ADC of FIG. 6A, except with gain and offset errors in its ADC slices and no calibration to remove those errors.
Figure 6C:
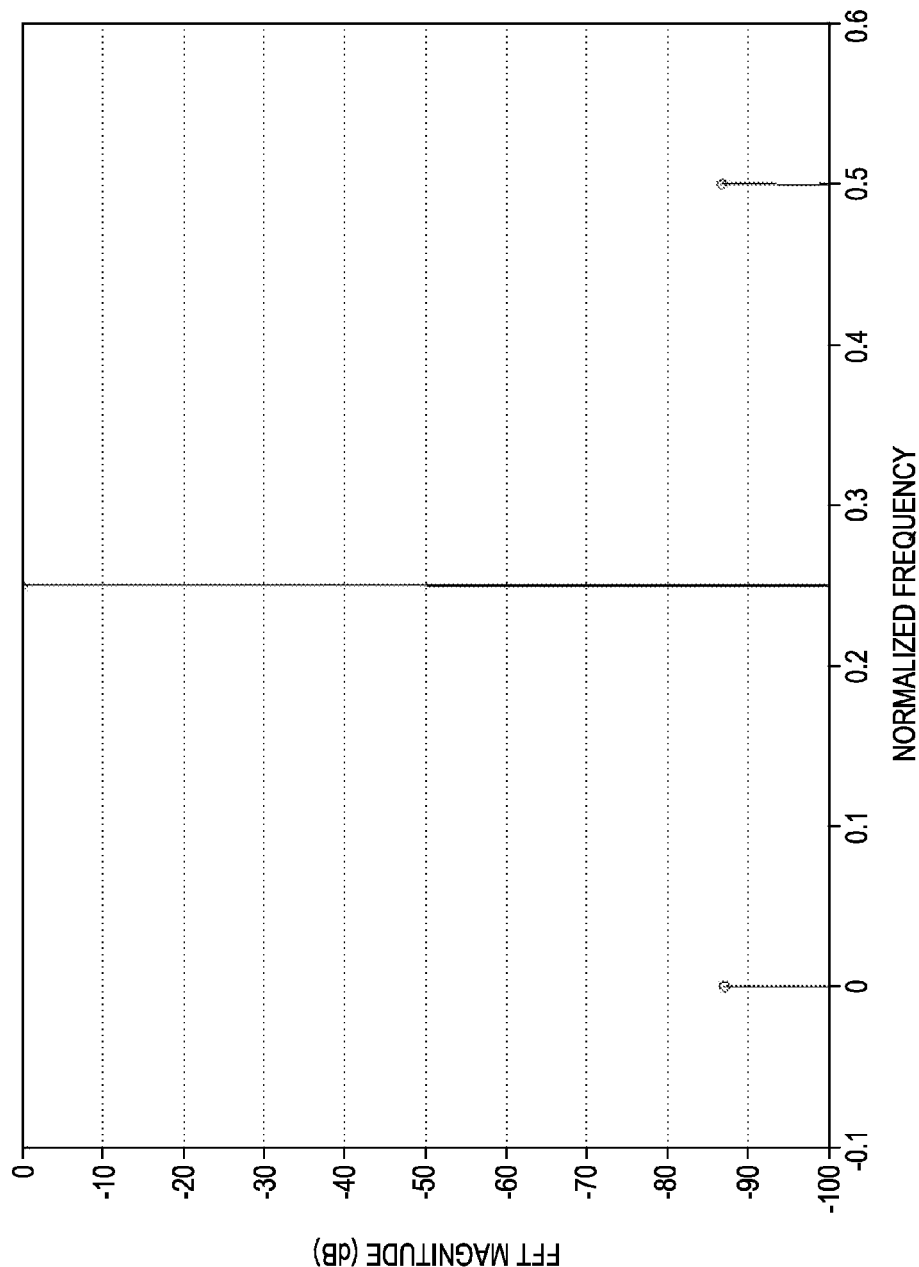
FIG. 6C is a graph illustrating an FFT spectrum of an output signal of the interleaved ADC of FIG. 6A, except with gain and offset errors in its ADC slices, and calibration to remove the errors.
Figure 6D:
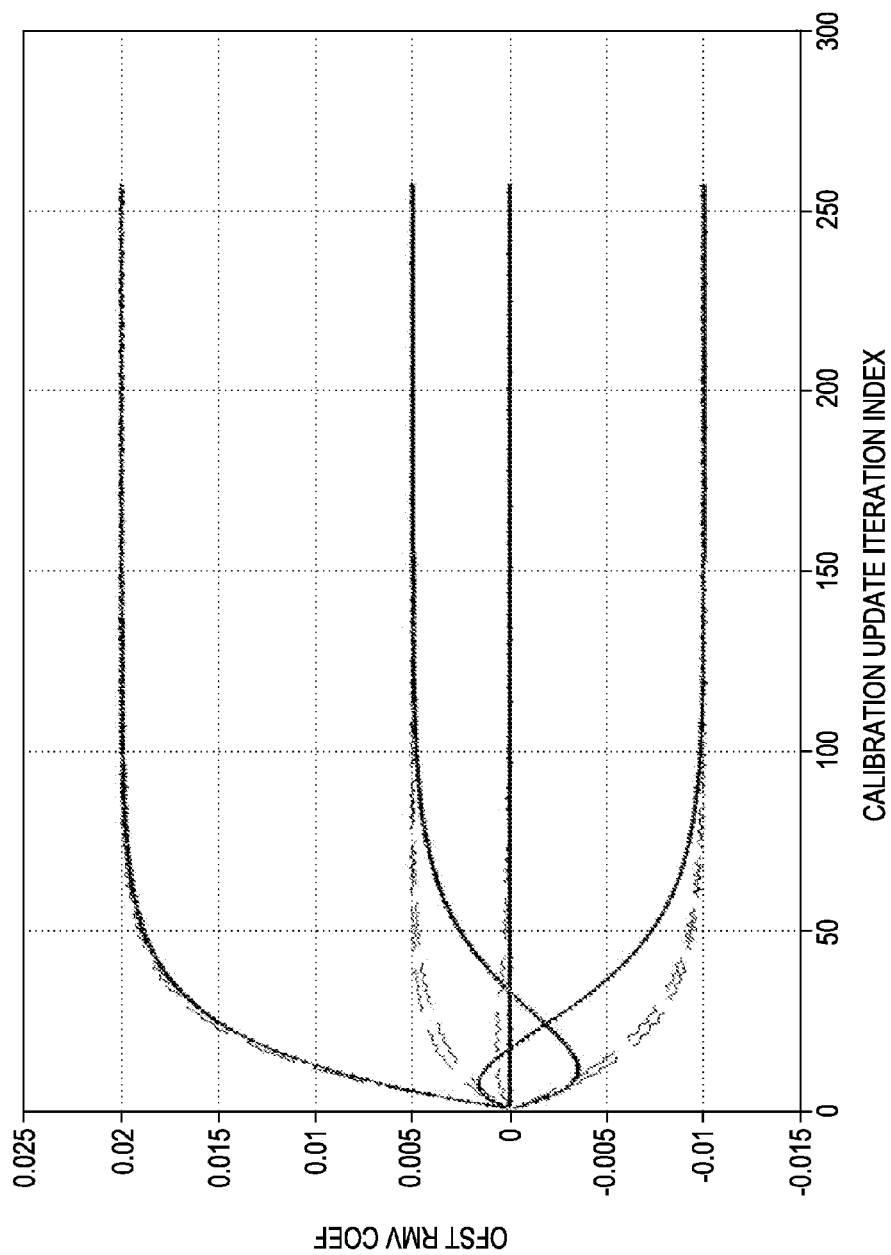
FIG. 6D is a graph illustrating the convergence of a first calibration coefficient for the interleaved ADC of FIG. 6C.
Figure 6E:
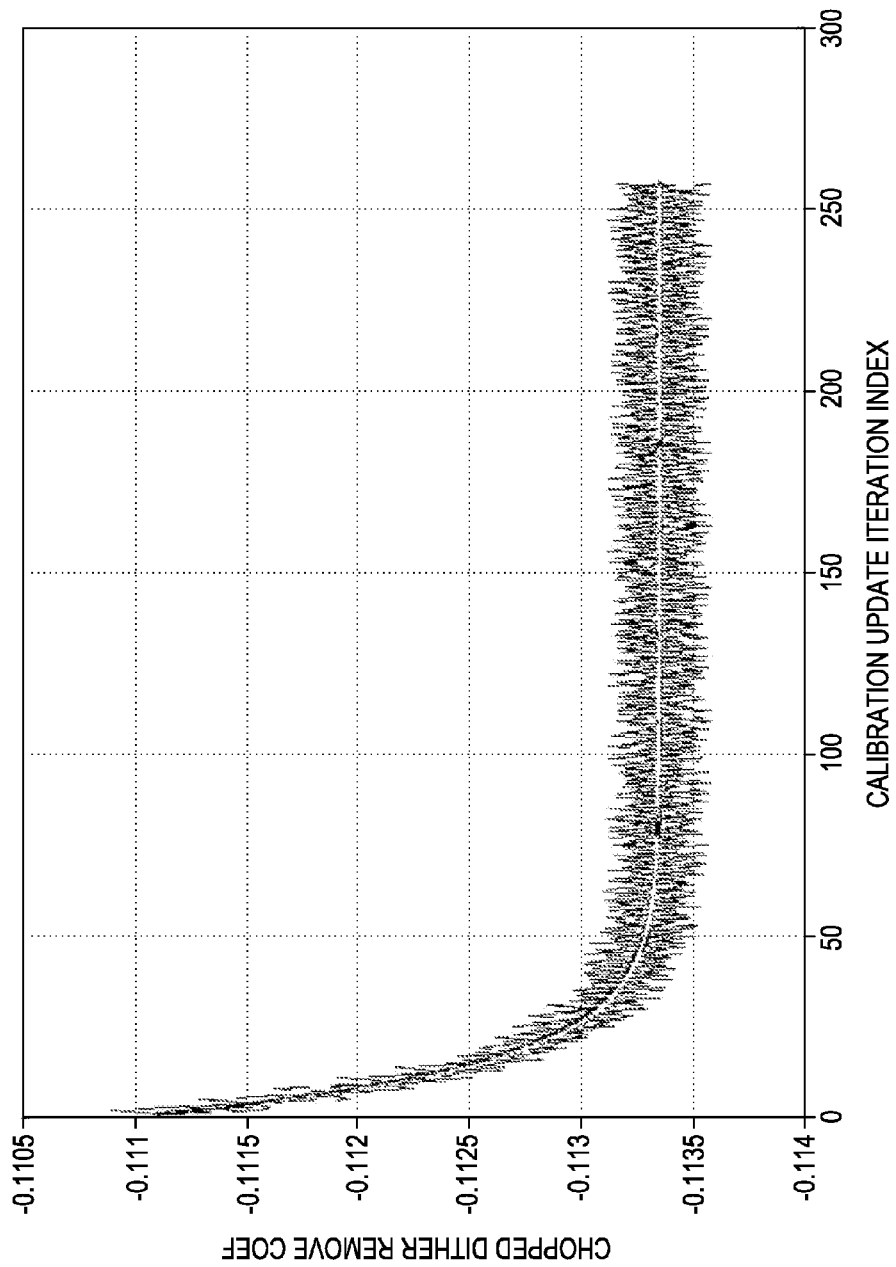
FIG. 6E is a graph illustrating the convergence of a second calibration coefficient for the interleaved ADC of FIG. 6C.
Figure 6F:
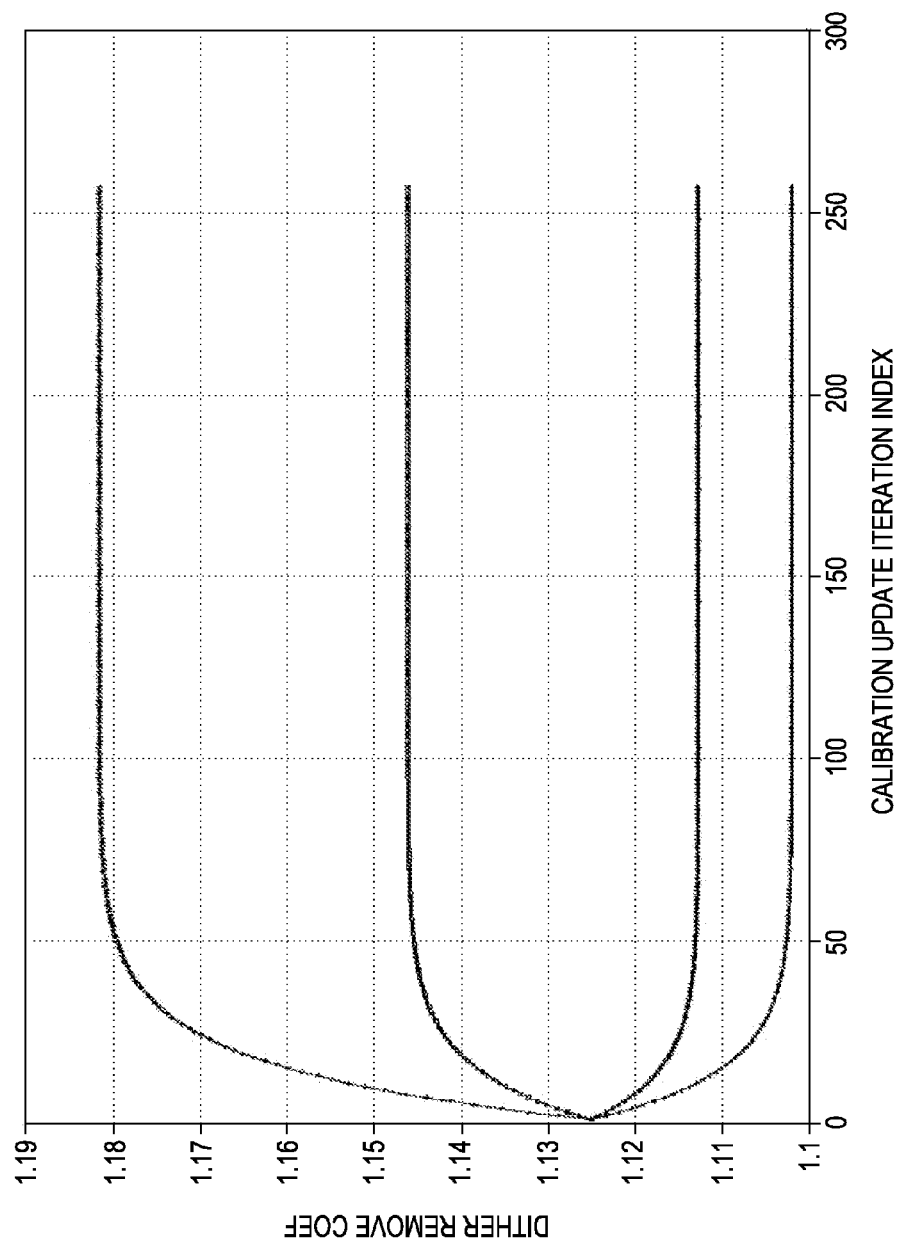
FIG. 6F is a graph illustrating the convergence of a third calibration coefficient for the interleaved ADC of FIG. 6C.

FIGS. 6A through 6C show the results of simulations performed under the same conditions as in FIGS. 4A through 4C, respectively, except that the sinusoidal input has a frequency at a multiple of the slice clock rate i.e. a sub-harmonic of the overall clock rate. As illustrated by FIGS. 6D through 6F, the coefficients converge to the same values as in FIGS. 4D through 4F, indicating that the calibration works well with this additional type of input signal. This flexibility may make the partial chopping approach attractive for instrumentation applications where it is not possible to impose or expect specific conditions or statistics in the input signal.

While example embodiments are disclosed herein, one of ordinary skill in the art appreciates that many variations that are in accordance with the present teachings are possible and remain within the scope of the appended claims. The invention therefore is not to be restricted except within the scope of the appended claims.

The invention claimed is:

1. A method of operating an interleaved analog-to-digital converter (ADC) comprising a plurality of ADC slices, comprising:
    adding a dither to an analog input signal based on a dither sequence, and thereafter splitting the analog input signal into first and second signal components;
    transmitting the respective first and second signal components through a first signal path and a second signal path;
    chopping the second signal component in the second signal path using a chopping sequence to produce a chopped second signal component;
    recombining the chopped second signal component with the first signal component to produce a composite signal;
    digitizing the composite signal by operating the ADC slices in an alternating fashion to produce a plurality of digital samples;
    adjusting the digital samples according to estimated voltage offset errors of the ADC slices determined in relation to the dither sequence and the chopping sequence; and
    adjusting the digital samples according to estimated gain errors of the ADC slices determined in relation to the dither sequence and the chopping sequence.

2. The method of claim 1, wherein the dither sequence and the chopping sequence are pseudorandom sequences.

3. The method of claim 1, further comprising combining the adjusted digital samples to produce an output signal with an effective sampling rate that is a multiple of an effective sampling rate of the ADC slices.

4. The method of claim 1, wherein a sum of a gain of the first signal path and a gain of the second signal path is approximately one.

5. The method of claim 4, further comprising estimating a ratio of the gain of the second signal path to the gain of the first signal path, and adjusting digital samples in at least one of the ADC slices according to the estimated ratio.

6. The method of claim 5, further comprising iteratively tuning the estimated ratio.

7. The method of claim 5, wherein the ratio is estimated by an adaptive least mean squares (LMS) algorithm.

8. The method of claim 1, wherein adjusting the digital samples according to estimated voltage offset errors comprises determining a digital offset correction coefficient for a corresponding ADC slice, and adding the digital offset correction coefficient to digital samples of the corresponding ADC slice.

9. The method of claim 8, wherein the digital offset correction coefficient is determined by an adaptive least mean squares (LMS) algorithm.

10. The method of claim 8, further comprising iteratively tuning the digital offset correction coefficient.

11. A system, comprising:
    an input stage configured to apply a dither to an analog input signal based on a dither sequence, then split the analog input signal into first and second signal components, to transmit the first and second signal components through a first signal path and a second signal path, respectively, wherein the second signal path chops the second signal component according to a chopping sequence to produce a chopped second signal component, and to combine the first signal component with the chopped second signal component to produce a composite signal;
    a plurality of analog-to-digital converter (ADC) slices configured to digitize the composite signal in an alternating fashion to produce a plurality of digital samples; and
    a plurality of calibration units corresponding to the plurality of ADC slices, each calibration unit configured to adjust a corresponding subset of the digital samples according to a corresponding estimated voltage offset error determined in relation to the dither sequence and the chopping sequence, wherein each calibration unit is further configured to adjust the corresponding subset of digital samples according to a corresponding gain error determined in relation to the dither sequence and the chopping sequence.

12. The system of claim 11, further comprising a pseudorandom number generator configured to generate the dither sequence and the chopping sequence.

13. The system of claim 11, further comprising an interleaving component configured to combine the adjusted digital samples from each of the calibration units to produce an output signal with an effective sampling rate that is a multiple of an effective sampling rate of the ADC slices.

14. The system of claim 11, wherein a sum of a gain of the first signal path and a gain of the second signal path is approximately one.

15. The system of claim 14, wherein each of the calibration units is configured to estimate a ratio of the gain of the second signal path to the gain of the first signal path and to adjust digital samples according to the estimated ratio.

16. The system of claim 15, wherein the ratio is estimated by an adaptive least mean squares (LMS) algorithm.

17. A system, comprising:
    an input stage configured to apply a dither to an analog input signal based on a dither sequence, then split the analog input signal into first and second signal components, to transmit the first and second signal components through a first signal path and a second signal path, respectively, wherein the second signal path chops the second signal component according to a chopping sequence to produce a chopped second signal component, and to combine the first signal component with the chopped second signal component to produce a composite signal;
    a plurality of analog-to-digital converter (ADC) slices configured to digitize the composite signal in an alternating fashion to produce a plurality of digital samples; and
    a plurality of calibration units corresponding to the plurality of ADC slices, each calibration unit configured to adjust a corresponding subset of the digital samples according to a corresponding estimated voltage offset error determined in relation to the dither sequence and the chopping sequence, wherein the digital samples are adjusted by determining a digital offset correction coefficient and adding the digital offset correction coefficient to the digital samples.

18. The system of claim 17, wherein the digital offset correction coefficient is determined by an adaptive least mean squares (LMS) algorithm.

19. The system of claim 18, wherein each calibration unit is further configured to adjust the corresponding subset of digital samples according to a corresponding gain error determined in relation to the dither sequence and the chopping sequence.

20. The system of claim 19, further comprising a pseudorandom number generator configured to generate the dither sequence and the chopping sequence.

21. The system of claim 19, further comprising an interleaving component configured to combine the adjusted digital samples from each of the calibration units to produce an output signal with an effective sampling rate that is a multiple of an effective sampling rate of the ADC slices.

22. The system of claim 19, wherein a sum of a gain of the first signal path and a gain of the second signal path is approximately one.

23. The system of claim 18, wherein each of the calibration units is configured to estimate a ratio of the gain of the second signal path to the gain of the first signal path and to adjust digital samples according to the estimated ratio.

24. The system of claim 23, wherein the ratio is estimated by an adaptive least mean squares (LMS) algorithm.

* * * * *

UNITED STATES PATENT AND TRADEMARK OFFICE
CERTIFICATE OF CORRECTION

| | | |
|---|---|---|
| PATENT NO. | : 9,143,147 B1 | Page 1 of 1 |
| APPLICATION NO. | : 14/323821 | |
| DATED | : September 22, 2015 | |
| INVENTOR(S) | : Sourja Ray and John Patrick Keane | |

It is certified that error appears in the above-identified patent and that said Letters Patent is hereby corrected as shown below:

In the Claims

In Claim 19 (Column 13, Line 7), delete "claim 18," and insert -- claim 17, --, therefor.

In Claim 23 (Column 13, Line 23), delete "claim 18," and insert -- claim 17, --, therefor.

Signed and Sealed this
Thirty-first Day of May, 2016

Michelle K. Lee
*Director of the United States Patent and Trademark Office*